US010274178B2

(12) United States Patent
Yoshida et al.

(10) Patent No.: US 10,274,178 B2
(45) Date of Patent: Apr. 30, 2019

(54) PEDESTRIAN SAFETY SYSTEM AND WEARABLE MEMBER HAVING LIGHT EMITTING FUNCTION

(71) Applicant: DENSO CORPORATION, Kariya, Aichi-pref. (JP)

(72) Inventors: Ichiro Yoshida, Kariya (JP); Kiyohiko Sawada, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 312 days.

(21) Appl. No.: 15/034,188

(22) PCT Filed: Oct. 17, 2014

(86) PCT No.: PCT/JP2014/005270
§ 371 (c)(1),
(2) Date: May 4, 2016

(87) PCT Pub. No.: WO2015/068339
PCT Pub. Date: May 14, 2015

(65) Prior Publication Data
US 2016/0265762 A1 Sep. 15, 2016

(30) Foreign Application Priority Data
Nov. 6, 2013 (JP) ................................ 2013-230268

(51) Int. Cl.
*H02J 17/00* (2006.01)
*H02J 50/00* (2016.01)
(Continued)

(52) U.S. Cl.
CPC .......... *F21V 23/023* (2013.01); *H01L 27/156* (2013.01); *H02J 5/005* (2013.01);
(Continued)

(58) Field of Classification Search
CPC ....... A41D 13/01; H01L 27/156; H02J 5/005; H02J 17/00; H02J 50/00; H02J 50/30;
(Continued)

(56) References Cited

U.S. PATENT DOCUMENTS 4,709,307 A * 11/1987 Branom ............... A41D 27/085
362/103
5,017,436 A * 5/1991 Schwarz ................. B32B 27/08
428/519
(Continued)

FOREIGN PATENT DOCUMENTS

JP 2006070416 A 3/2006
JP 2006232172 A 9/2006
(Continued)

*Primary Examiner* — Hargobind S Sawhney
(74) *Attorney, Agent, or Firm* — Harness, Dickey & Pierce, P.L.C.

(57) ABSTRACT

A pedestrian safety system includes a power transmission unit provided to a vehicle and transmitting an electric power, a power reception unit provided to a wearable member being wearable by a pedestrian and receiving the electric power transmitted from the power transmission unit, a power storage unit provided to the wearable member and storing the electric power received by the power reception unit, and at least one light emitting unit provided to the wearable member. The at least one light emitting unit performs a flash or illumination operation with a supply of the electric power stored in the power storage unit as an operational power. With this pedestrian safety system, pedestrian's safety can be properly ensured without disposing an operational power source of the light emitting unit on the pedestrian side.

7 Claims, 21 Drawing Sheets

(51) Int. Cl.

| | | |
|---|---|---|
| *F21V 23/02* | (2006.01) | |
| *H02J 7/02* | (2016.01) | |
| *H02J 50/40* | (2016.01) | |
| *H01L 27/15* | (2006.01) | |
| *H05B 33/08* | (2006.01) | |
| *H05B 37/02* | (2006.01) | |
| *H02J 5/00* | (2016.01) | |
| *H02J 50/12* | (2016.01) | |
| *H02J 50/20* | (2016.01) | |
| *H02J 50/80* | (2016.01) | |
| *H02J 50/05* | (2016.01) | |
| *A41D 13/01* | (2006.01) | |
| *G08G 1/005* | (2006.01) | |

(52) U.S. Cl.
CPC .............. *H02J 7/025* (2013.01); *H02J 17/00* (2013.01); *H02J 50/12* (2016.02); *H02J 50/20* (2016.02); *H02J 50/40* (2016.02); *H02J 50/80* (2016.02); *H05B 33/0842* (2013.01); *H05B 37/0218* (2013.01); *H05B 37/0227* (2013.01); *A41D 13/01* (2013.01); *G08G 1/005* (2013.01); *H02J 50/05* (2016.02)

(58) Field of Classification Search
CPC .. H02J 50/40; H02J 50/50; H02J 50/80; H02J 7/025; H05B 33/0842; H05B 33/0857; H05B 37/0218; H05B 37/0227; F21S 9/02; F21V 23/04; F21V 23/0435
See application file for complete search history.

(56) References Cited

U.S. PATENT DOCUMENTS

| | | | | |
|---|---|---|---|---|
| 5,070,436 A * | 12/1991 | Alexander | ............. | A41D 13/01 340/321 |
| 6,517,214 B1 * | 2/2003 | Mitchell, Jr. | .......... | A41D 13/01 2/94 |
| 2002/0163800 A1 * | 11/2002 | Hansen | .................... | A44B 1/04 362/103 |
| 2008/0043458 A1 * | 2/2008 | Desjardin | .............. | A41D 13/01 362/108 |
| 2008/0298100 A1 * | 12/2008 | Esaka | ..................... | H01F 38/14 363/67 |
| 2010/0253501 A1 * | 10/2010 | Gibson | .................. | A41D 13/01 340/475 |
| 2010/0313328 A1 * | 12/2010 | Shelton | .................. | A41D 13/01 2/102 |
| 2011/0001455 A1 * | 1/2011 | Dowdy | ..................... | F21S 9/02 320/107 |
| 2012/0081885 A1 * | 4/2012 | Schrimmer | ........ | A41D 19/0157 362/106 |
| 2012/0229085 A1 * | 9/2012 | Lau | ..................... | B60L 11/1818 320/109 |
| 2013/0335015 A1 * | 12/2013 | Ichikawa | ................ | H02J 7/025 320/108 |
| 2014/0015470 A1 * | 1/2014 | Lim | ........................ | H02J 7/35 320/101 |
| 2015/0381240 A1 | 12/2015 | Yoshida et al. | | |

FOREIGN PATENT DOCUMENTS

| | | |
|---|---|---|
| JP | 2011136675 A | 7/2011 |
| JP | 2012113879 A | 6/2012 |
| JP | 2012125387 A | 7/2012 |
| JP | 2013100611 A | 5/2013 |
| JP | 2013165043 A | 8/2013 |
| JP | 2014167527 A | 9/2014 |

* cited by examiner

FIG. 11

| INITIAL ID | TWO-DIMENSIONAL COORDINATE |
|---|---|
| NNN | $(x_{a1}, y_{a1})$ |
| NNN | $(x_{a2}, y_{a2})$ |
| NNN | $(x_{a3}, y_{a3})$ |
| NNN | $(x_{a4}, y_{a4})$ |
| NNN | $(x_{a5}, y_{a5})$ |
| NNN | $(x_{a6}, y_{a6})$ |
| ⋮ | ⋮ |

FIG. 14A
ILLUMINATE LIGHT EMITTING DEVICE (1, 1)

| ILLUMINATE | DETECT | | |
|---|---|---|---|
| DETECT | | | |
| | | | |
| | | | |

FIG. 14B
ILLUMINATE LIGHT EMITTING DEVICES (2, 1) (1, 2)

| INITIAL ID IS CORRELATED WITH ARRANGEMENT ID OF (1, 1) | ILLUMINATE | DETECT | |
|---|---|---|---|
| ILLUMINATE | DETECT | | |
| DETECT | | | |
| | | | |

FIG. 14C
ILLUMINATE LIGHT EMITTING DEVICES (3, 1) (2, 2) (1, 3)

| INITIAL ID IS CORRELATED WITH ARRANGEMENT ID OF (1, 1) | INITIAL ID IS CORRELATED WITH ARRANGEMENT ID OF (2, 1) | ILLUMINATE | DETECT |
|---|---|---|---|
| INITIAL ID IS CORRELATED WITH ARRANGEMENT ID OF (1, 2) | ILLUMINATE | DETECT | |
| ILLUMINATE | DETECT | | |
| DETECT | | | |

FIG. 15

| INITIAL ID (NNN) ARRANGEMENT ID (1,1) | INITIAL ID (NNN) ARRANGEMENT ID (2,1) | INITIAL ID (NNN) ARRANGEMENT ID (3,1) | INITIAL ID (NNN) ARRANGEMENT ID (4,1) | ... | INITIAL ID (NNN) ARRANGEMENT ID (m,1) |
|---|---|---|---|---|---|
| INITIAL ID (NNN) ARRANGEMENT ID (1,2) | INITIAL ID (NNN) ARRANGEMENT ID (2,2) | INITIAL ID (NNN) ARRANGEMENT ID (3,2) | INITIAL ID (NNN) ARRANGEMENT ID (4,2) | ... | INITIAL ID (NNN) ARRANGEMENT ID (m,2) |
| INITIAL ID (NNN) ARRANGEMENT ID (1,3) | INITIAL ID (NNN) ARRANGEMENT ID (2,3) | INITIAL ID (NNN) ARRANGEMENT ID (3,3) | INITIAL ID (NNN) ARRANGEMENT ID (4,3) | ... | INITIAL ID (NNN) ARRANGEMENT ID (m,3) |
| INITIAL ID (NNN) ARRANGEMENT ID (1,4) | INITIAL ID (NNN) ARRANGEMENT ID (2,4) | INITIAL ID (NNN) ARRANGEMENT ID (3,4) | INITIAL ID (NNN) ARRANGEMENT ID (4,4) | ... | INITIAL ID (NNN) ARRANGEMENT ID (m,4) |
| ... | ... | ... | ... | ... | ... |
| INITIAL ID (NNN) ARRANGEMENT ID (1,n) | INITIAL ID (NNN) ARRANGEMENT ID (2,n) | INITIAL ID (NNN) ARRANGEMENT ID (3,n) | INITIAL ID (NNN) ARRANGEMENT ID (4,n) | ... | INITIAL ID (NNN) ARRANGEMENT ID (m,n) |

FIG. 17

| INITIAL ID | TWO-DIMENSIONAL COORDINATE |
|---|---|
| NNN | $(x_{b1}, y_{b1})$ |
| NNN | $(x_{b2}, y_{b2})$ |
| NNN | $(x_{b3}, y_{b3})$ |
| NNN | $(x_{b4}, y_{b4})$ |
| NNN | $(x_{b5}, y_{b5})$ |
| NNN | $(x_{b6}, y_{b6})$ |
| ⋮ | ⋮ |

PEDESTRIAN SAFETY SYSTEM AND WEARABLE MEMBER HAVING LIGHT EMITTING FUNCTION

CROSS REFERENCE TO RELATED APPLICATIONS

This application is a U.S. National Phase Application under 35 U.S.C. 371 of International Application No. PCT/JP2014/005270 filed on Oct. 17, 2014 and published in Japanese as WO 2015/068339 A1 on May 14, 2015. This application is based on and claims the benefit of priority from Japanese Patent Application No. 2013-230268 filed on Nov. 6, 2013. The entire disclosures of all of the above applications are incorporated herein by reference.

TECHNICAL FIELD

The present disclosure relates to a pedestrian safety system that ensures pedestrian safety, and also relates to a wearable member having a light emitting function and wearable by a pedestrian.

BACKGROUND ART

Conventionally, a garment provided having a light emitting function (light emitting garment) has been provided to ensure a pedestrian's safety. The garment includes a light emitting unit such as a light emitting diode and an inorganic electroluminescence (EL). Since the light emitting unit of the garment is illuminable (able to emit light) at nighttime, a driver can recognize the existence of a pedestrian who wears the light emitting garment to ensure the pedestrian's safety (see Patent Literatures 1 to 3).

However, in each art disclosed in Patent Literatures 1 to 3, a rechargeable battery is provided to the light emitting garment and the power supplied from the rechargeable battery operates the light emitting unit. Thus, an illuminative period of the light emitting unit is limited. Therefore, when the charging amount becomes insufficient during an illumination required period, the light emitting unit may stop the illumination. That is, the light emitting garment fails to act out the illumination function. This may adversely affect ensuring of the pedestrian's safety. Additionally, charging of a rechargeable battery is disadvantageously troublesome. Further, the garment has an increased size and an increased weight due to the mounted battery. Thus, a user may feel uncomfortable to wear the heavy and big sized garment.

PRIOR ART LITERATURES

Patent Literatures

[Patent Literature 1] JP 2006-070416A
[Patent Literature 2] JP 2011-136675A
[Patent Literature 3] JP 2013-100611A

SUMMARY OF INVENTION

In view of the foregoing difficulties, it is an object of the present disclosure to provide a pedestrian safety system and a wearable member having a light emitting function, each of which appropriately ensures pedestrian's safety without disposing a power source for supplying operational power to a light emitting unit on the pedestrian.

According to an aspect of the present disclosure, a pedestrian safety system includes a power transmission unit provided to a vehicle and transmitting an electric power, a power reception unit provided to a wearable member being wearable by a pedestrian and receiving the electric power transmitted from the power transmission unit, a power storage unit provided to the wearable member and storing the electric power received by the power reception unit, and a plurality of light emitting units provided to the wearable member. Each of the plurality of light emitting units is capable of performing a flash or illumination operation with a supply of the electric power stored in the power storage unit as an operational power. The power transmission unit transmits an electromagnetic wave. The power reception unit receives the electromagnetic wave transmitted from the power transmission unit and generates, as the electric power transmitted from the power transmission unit, an electric power using the received electromagnetic wave. The plurality of light emitting units are arranged at regular intervals and each of the plurality of light emitting units has an individual arrangement ID. Each of the plurality of light emitting units performs the flash or illumination operation when the individual arrangement ID is specified by the electromagnetic wave received by the power reception unit.

In the above pedestrian safety system, the power source supplying the operational power to the light emitting unit is disposed on the vehicle side instead of on the pedestrian. Then, the power transmitted from the power transmission unit of the vehicle is received by the power reception unit and stored in the power storage unit. The power is used for illuminating the light emitting unit. Therefore, the pedestrian's safety can be appropriately secured without disposing the power source supplying the operational power to the light emitting unit on the pedestrian.

According to another aspect of the present disclosure, a wearable member, which has a light emitting function and is wearable by a pedestrian, includes a power reception unit receiving an electric power transmitted from a power transmission unit provided to a vehicle, a power storage unit storing the power received by the power reception unit, and a plurality of light emitting units each of which being capable of performing a flash or illumination operation with use of the electric power stored in the power storage unit as an operational power. The power transmission unit transmits an electromagnetic wave. The power reception unit receives the electromagnetic wave transmitted from the power transmission unit and generates, as the electric power transmitted from the power transmission unit, an electric power using the received electromagnetic wave. The plurality of light emitting units are arranged at regular intervals and each of the plurality of light emitting units has an individual arrangement ID. Each of the plurality of light emitting units performs the flash or illumination operation when the individual arrangement ID is specified by the electromagnetic wave received by the power reception unit.

The above wearable member having the light emitting function can appropriately secure pedestrian's safety without disposing the power source supplying the operational power to the light emitting unit on the pedestrian.

BRIEF DESCRIPTION OF DRAWINGS

The above and other objects, features and advantages of the present invention will become more apparent from the following detailed description made with reference to the accompanying drawings. In the drawings:

FIG. 11 is a diagram showing correlations between initial IDs and two-dimensional coordinates in the first arrangement ID setting;

FIGS. 14A to 14C are diagrams showing an example for detecting illumination of the light emitting units;

FIG. 15 is a diagraming showing correlations between the initial IDs and arrangement IDs;

FIG. 17 is a diagram showing correlations between the initial IDs and two-dimensional coordinates in the second arrangement ID setting;

EMBODIMENTS FOR CARRYING OUT INVENTION

Figure 1:
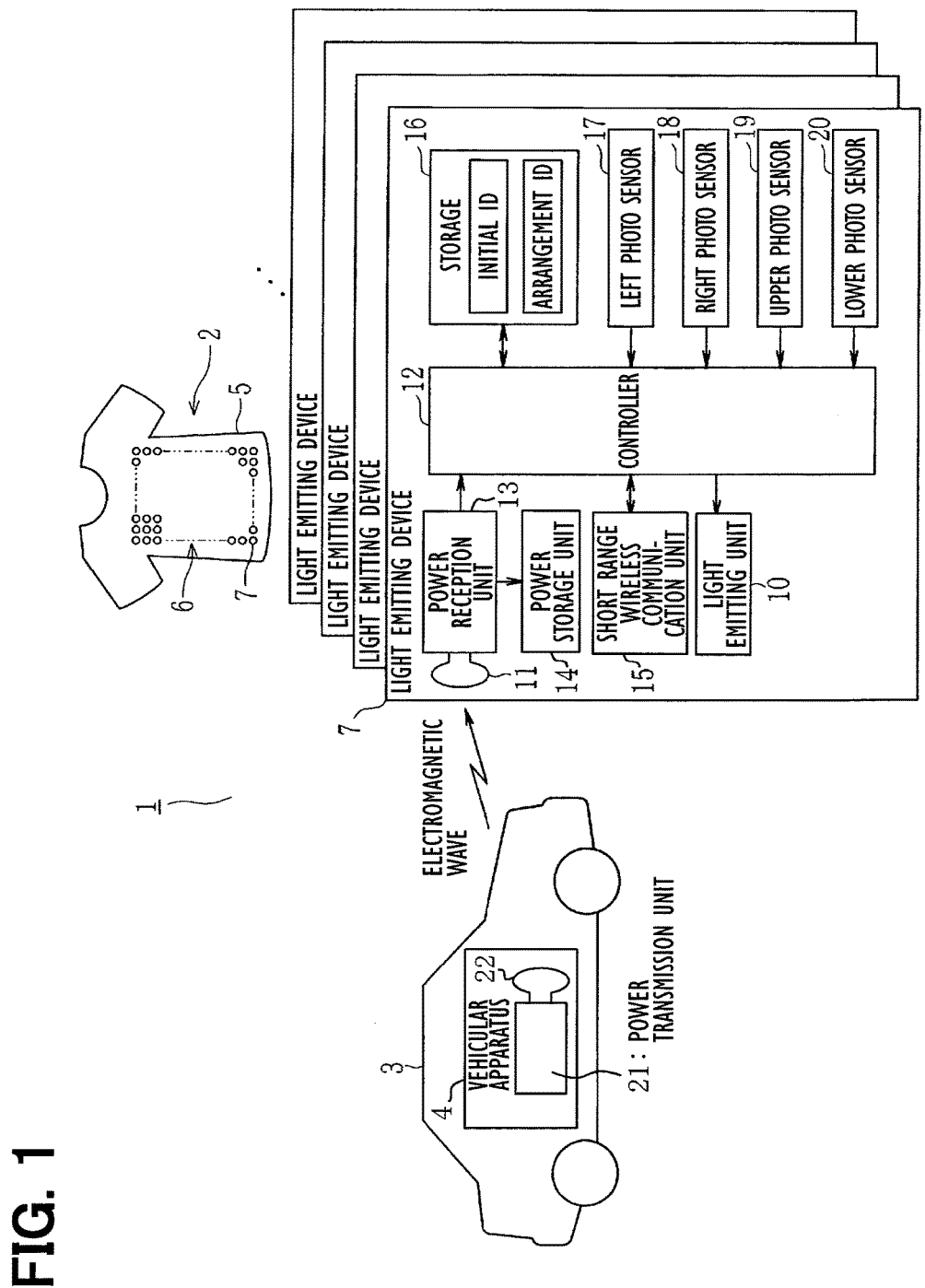
FIG. 1 is a functional block diagram showing an overall configuration according to one embodiment of the present disclosure.

The following will describe a wearable member having a light emitting function according to an embodiment of the present disclosure. In this embodiment, a garment having a light emitting function (hereinafter referred to as a light emitting garment) will be described as an example of the wearable member having the light emitting function with reference to the drawings.

A pedestrian safety system 1 includes a light emitting garment 2 a pedestrian wears and a vehicular apparatus 4 equipped to a vehicle (automobile) 3 under an assumption that the pedestrian wears (is mounted with) the light emitting garment 2. The light emitting garment 2 includes a light emitting device group 6 attached to a garment 5 made of cloth and fabric. The light emitting device group 6 includes light emitting devices 7 each of which has an electronic component and is usable outdoor. Thus, liquid resistance treatment or liquid repelling treatment is preferably treated to a portion to which the light emitting device group 6 is attached. In consideration of washing of the garment 5, the light emitting device group 6 may be detachably attached to the garment 5 instead of direct attachment to the garment 5 in fixed manner. For example, light emitting device group 6 may be indirectly attached to the garment 5 by attaching the light emitting device group 6 to a cloth and attaching the cloth to the garment 5. The light emitting devices 7 may be sealed by a waterproof or water-repellent capsule.

Figure 2:
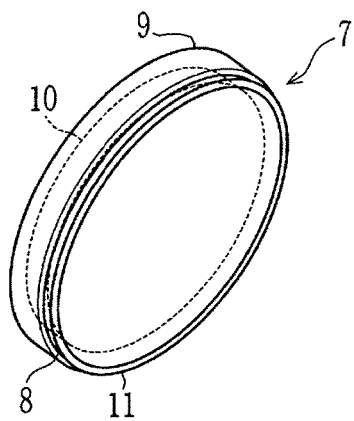
FIG. 2 is a diagram showing a perspective view of a light emitting device viewed from the back.

The light emitting device group 6 includes the multiple light emitting devices 7 arranged two-dimensionally (on a plane) at regular intervals. As illustrated in FIG. 2, each light emitting device 7 forming the light emitting device group 6 includes a combination of a circular planar substrate 8 and a circular planar light guide plate 9 that is overlapped on the circular planar substrate 8. The light emitting device 7 has a generally flat cylindrical shape. A light emitting unit 10 is built in the light guide plate 9. An annular reception coil 11 is provided to the substrate 8 along the outer periphery of the substrate 8. The reception coil 11 functions as an antenna. Instead of the reception coil 11, a flat antenna or a chip antenna may be used. To increase power reception efficiency, the reception coil 11 may be held by a material whose permeability and permittivity are adjustable.

Figure 3:
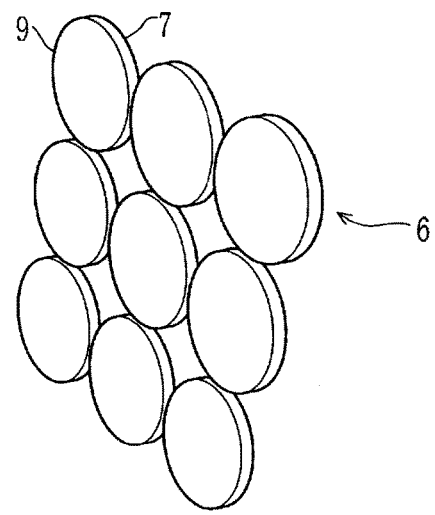
FIG. 3 is a diagram showing a perspective view of a light emitting device group viewed from the front.
Figure 4:
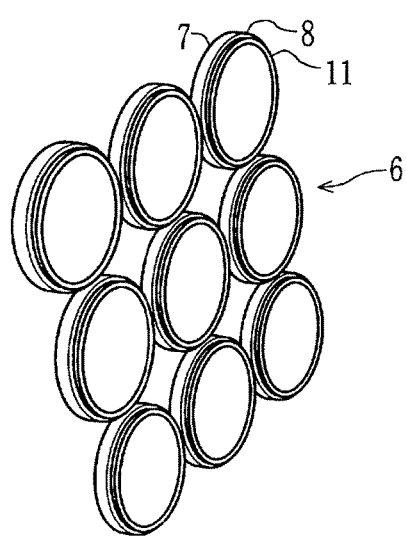
FIG. 4 is a diagram showing a perspective view of the light emitting device group viewed from the back.

As illustrated in FIGS. 3 and 4, the light emitting device group 6 includes the multiple light emitting devices 7 arranged two-dimensionally ("3×3" is illustrated as an example in FIGS. 3 and 4). The light emitting unit 10 of each light emitting device 7 switches between flash or illumination mode and turn-off mode to function as a pixel and displays specific information (characters and images). That is, the light emitting device group 6 including a horizontal arrangement of sixteen light emitting devices 7 and a vertical arrangement of sixteen light emitting devices 7 has a similar structure as a display apparatus having a resolution of "16×16=256." The resolution is determined by the number of the combined light emitting devices 7.

As illustrated in FIG. 1, each light emitting device 7 includes, as an electric configuration, a controller 12, a power reception unit 13, a power storage unit 14, a short range wireless communication unit 15, a storage 16, a left photo sensor 17, a right photo sensor 18, an upper photo sensor 19, a lower photo sensor 20, and the above light emitting unit 10. The controller 12 includes a known microcomputer having a CPU (Central Processing Unit), a ROM (Read Only Memory), a RAM (Random Access Memory), and an I/O (Input/Output) bus. The controller 12 controls the entire operations of the light emitting device 7, such as a power reception control, a data communication control, and a storing operation control, by executing a computer program stored in the ROM.

The power reception unit 13 includes the above-described reception coil 11 and a power reception capacitor (not shown), and performs wireless charging (non-contact charging) using a radio wave reception method from an aftermentioned power transmission unit 21 of a vehicular apparatus 4. Specifically, the power reception unit 13 is able to receive electromagnetic waves through the dedicated short range communications (DSRC) used in the intelligent transport systems (ITS). Upon reception of electromagnetic waves transmitted from the power transmission unit 21 having the transmitting function of the dedicated short range communications, the power reception unit 13 generates electric power by rectifying the received electromagnetic waves and converting the rectified wave to direct-current current.

The power storage unit 14 stores the power generated by the power reception unit 13, and supplies the stored power to each functional block as the operational power for the light emitting device 7. The wireless charging using the radio wave reception method has an advantage to secure a longer power transmission distance than the wireless charging using other methods such as an electromagnetic induction type charging. The power transmission distance of 100 meters is approximately securable. The present embodiment describes the wireless charging using the radio wave reception method. As long as a power transmission distance required by the pedestrian safety system 1 is securable, the wireless charging based on other methods such as electromagnetic induction, magnetic field resonance, or electric field coupling may be used. The power transmission unit 21 includes a power transmission coil 22 and a power transmission capacitor (not shown).

When the reception coil 11 receives an electromagnetic wave, the power reception unit 13 demodulates the received electromagnetic wave to detect an activation signal, and outputs the activation signal to the controller 12. Upon reception of the activation signal from the power reception unit 13, the controller 12 is activated under a condition that sufficient power is supplied from the power storage unit 14 as the operational power. When activated, the controller 12 identifies an operation command included in the activation signal, and on the basis of the identified operation command, operates the light emitting unit 10 (switches between flash or illumination mode and turn-off mode).

The short range wireless communication unit 15 performs data communications with a short range wireless communication unit 54 of an external apparatus 51, which will be mentioned later, by short range wireless communications (such as Bluetooth (registered trademark) and wireless LAN (Local Area Network)). The storage 16 has a storage area assigned for an initial ID (initial information) and an arrangement ID (arrangement information). The initial ID is a predetermined ID stored during the manufacturing process of the light emitting device 7, and is valid before the two-dimensional combination of the light emitting devices 7 and the writing of the arrangement ID. The controller 12 outputs a read command to the storage 16 to read the initial ID from the storage 16. The arrangement ID is a predetermined ID that indicates optionally-writable positional information, and becomes valid after the two-dimensional combination of the light emitting devices 7 and the writing of the arrangement ID. The controller 12 outputs a write command to the storage 16 to write the arrangement ID to the storage 16. The arrangement ID indicates a two-dimensional coordinate (or a numeric value that indicates the two-dimensional coordinate) when the light emitting devices 7 are arranged in the two-dimensional combination as described in the present embodiment. A procedure to write the arrangement ID on the basis of the initial ID will be mentioned later.

Figure 5:
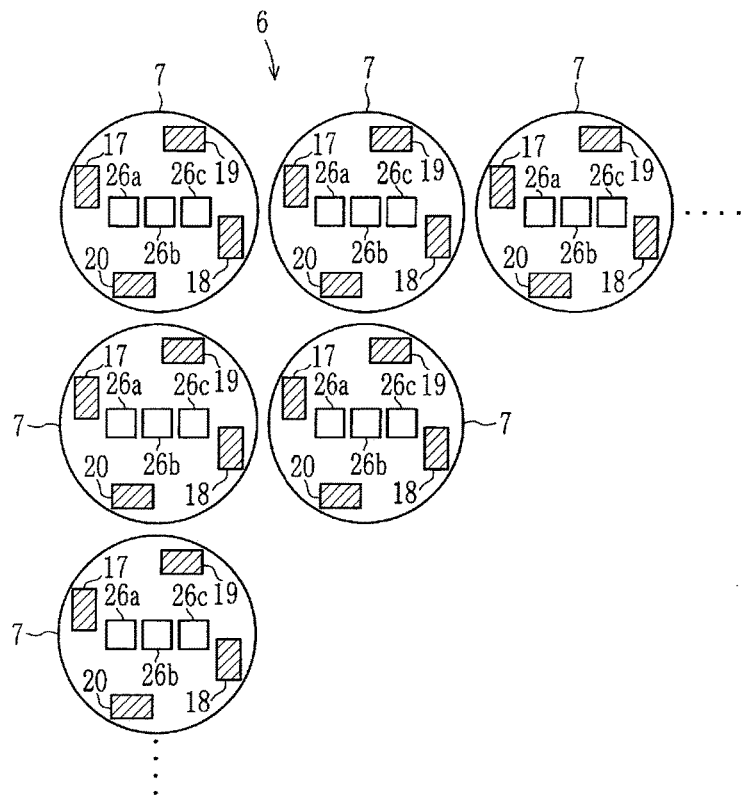
FIG. 5 is a diagram showing an example in which the light emitting devices are arranged two-dimensionally.

The left photo sensor 17 can detect flash or illumination of the light emitting device 7 positioned closely on the left side of the light emitting device 7 when viewed from the front (from a side where the light emitting unit 10 flashes or illuminates). Upon detection of the flash or illumination, the left photo sensor 17 outputs a detection signal to the controller 12. The right photo sensor 18 can detect flash or illumination of the light emitting device 7 positioned closely on the right side of the light emitting device 7 when viewed from the front. Upon detection of the flash or illumination, the right photo sensor 18 outputs a detection signal to the controller 12. The upper photo sensor 19 can detect the flash or illumination of the light emitting device 7 positioned closely on the upper side of the light emitting device 7 when viewed from the front. Upon detection of the flash or illumination, the upper photo sensor 19 outputs a detection signal to the controller 12. The lower photo sensor 20 can detect the flash or illumination of the light emitting device 7 positioned closely on the lower side of the light emitting device 7 when viewed from the front. Upon detection of the flash or illumination, the lower photo sensor 20 outputs a detection signal to the controller 12. Marks indicating the left, right, up, and down directions are provided to each light emitting device 7 by using a print and a stamp. As illustrated in FIG. 5, a worker who assembles the light emitting devices 7 can respectively identify the left, right, up, and down directions of each light emitting device 7 with the photo sensors 17 to 20 on the basis of the marks (for example, the assembling is carried out to position the left photo sensor 17 at the left when viewed from the front).

Figure 6:
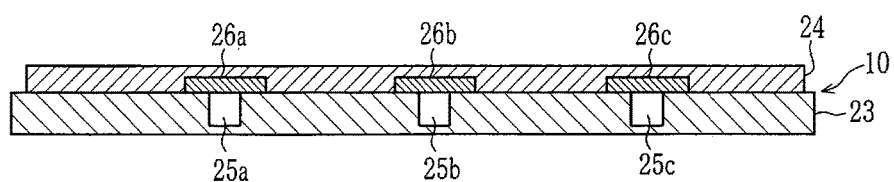
FIG. 6 is a diagram showing a cross-sectional view of the light emitting unit.

As illustrated in FIG. 6, the light emitting unit 10 includes a semiconductor substrate 23 and an optical diffusion layer 24 that is disposed in overlapped manner with the semiconductor substrate 23. Three LEDs 25a to 25c are disposed on the semiconductor substrate 23. A red filter 26a, a green filter 26b, and a blue filter 26c are provided to the optical diffusion layer 24 corresponding to the respective three LEDs 25a to 25c. The controller 12 individually controls illumination and turn-off of the three LEDs 25a to 25c, and individually controls light transmission amount of each of the red filter 26a, green filter 26b, and blue filter 26c. The controller 12 can reproduce many colors by changing the light transmission amount of each of the red filter 26a, green filter 26b, and blue filter 26c. When the light transmission amount of each of the red filter 26a, green filter 26b, and blue filter 26c is changed by eight degrees in relation to the illumination intensities of the LEDs 25a to 25c, the colors of "8×8×8=512" are reproducible. The illumination intensities of the LEDs 25a to 25c are controlled using 8 bits to reproduce 24-bit full color.

Figure 7C:
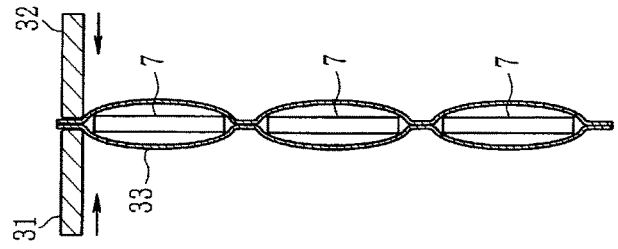
FIG. 7A to FIG. 7C are diagrams showing one example of embedding the light emitting device in a fabric.
Figure 7B:
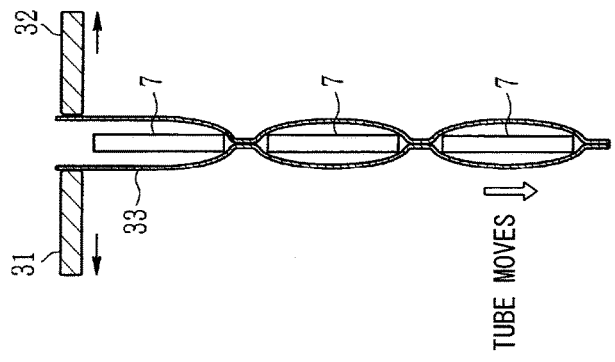
Figure 7A:
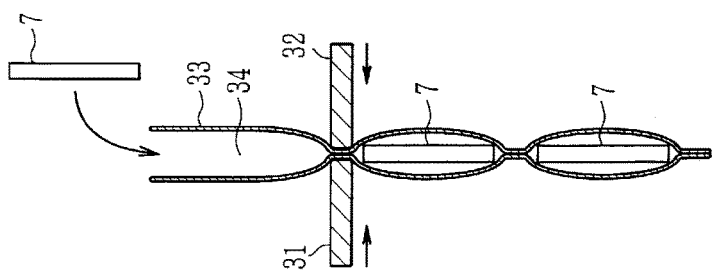

FIGS. 7A to 7C and FIGS. 8A to 8C illustrate examples in each of which the light emitting device 7 having the above-described configuration is embedded into the garment 5. Specifically, the light emitting device 7 is embedded into a fabric. FIGS. 7A to 7C illustrate a manufacturing procedure using pressure punches 31 and 32. As shown FIG. 7A, FIG. 7B, and FIG. 7C in described order, this manufacturing procedure has the heated pressure punches 31 and 32 reciprocally moved horizontally to shrink a tube 33 and to thus form a fixed position (insertion position) 34 for the light emitting device 7. Then, the light emitting device 7 is inserted into the fixed position 34. After that, the tube 33 is moved (downward in FIGS. 7A to 7C), the heated punches 31 and 32 are reciprocally moved horizontally to shrink the tube. Consequently, the light emitting device 7 is fixed to the fixed position 34. By repeating the same procedure, the fabric where the multiple light emitting devices 7 have been embedded can be manufactured. The garment 5 into which the multiple light emitting devices 7 have been embedded can be manufactured by stitching the fabric.

Figure 8A:
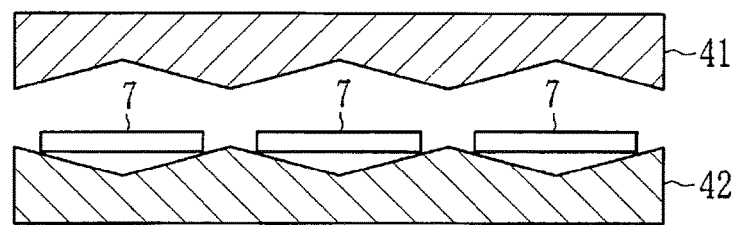
FIG. 8A to FIG. 8C are diagrams showing another example of embedding the light emitting device in a fabric.
Figure 8B:
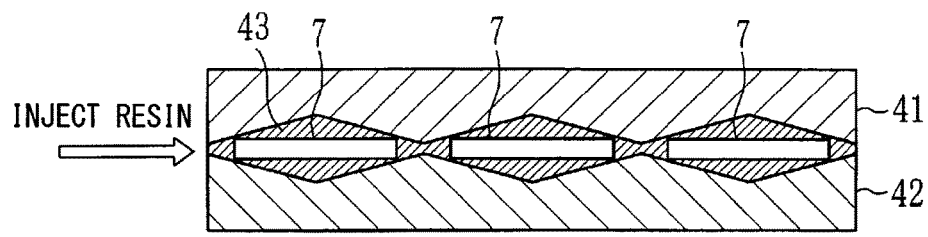
Figure 8C:
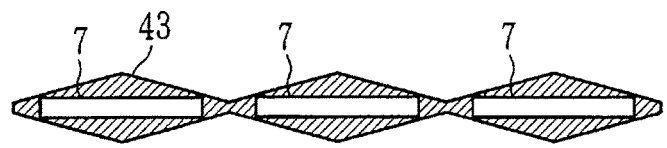

FIGS. 8A to 8C illustrate a manufacturing procedure using an injection-molding type upper mold 41 and an injection-molding type lower mold 42. In this procedure, as shown in FIG. 8A, FIG. 8B, and FIG. 8C in described order, after the light emitting devices 7 are arranged to the lower mold 42, the upper mold 41 and lower mold 42 are engaged with one another. After that, a resin 43 is injected into spaces defined by the upper mold 41 and lower mold 42. After solidified, the resin 43 is removed from the upper mold 41 and lower mold 42. Consequently, the fabric into which the multiple light emitting devices 7 have been embedded is manufactured. The garment 5 in which the multiple light emitting devices 7 have been embedded can be manufactured by stitching the fabric. The manufacturing procedure of FIG. 8A to FIG. 8C illustrates the horizontal injection of the resin 43 (in the same direction as the arrangement of the light emitting devices 7). In this case, by defining a hole in the center of each light emitting device 7, the resin 43 can be injected easily. When the resin 43 is injected from above (in a direction perpendicular to the arrangement direction of the light emitting devices 7), it is not necessary to make the hole in the center of each light emitting device 7.

The following will describe a procedure of writing the arrangement ID to each light emitting device 7 with reference to FIGS. 9 to 17. When the light emitting devices 7 having the initial ID is randomly attached to the garment 5, the arrangement IDs need to be written to the light emitting devices 7 in consideration of the after-mentioned group operation of the devices 7 cooperating with each other. That is, when operating the light emitting devices 7 as the after-mentioned group in cooperation with one another, the light emitting devices 7, to which the arrangement IDs are written, can be switched between flash or illumination mode and turn-off mode based on the arrangement IDs.

Figure 9:
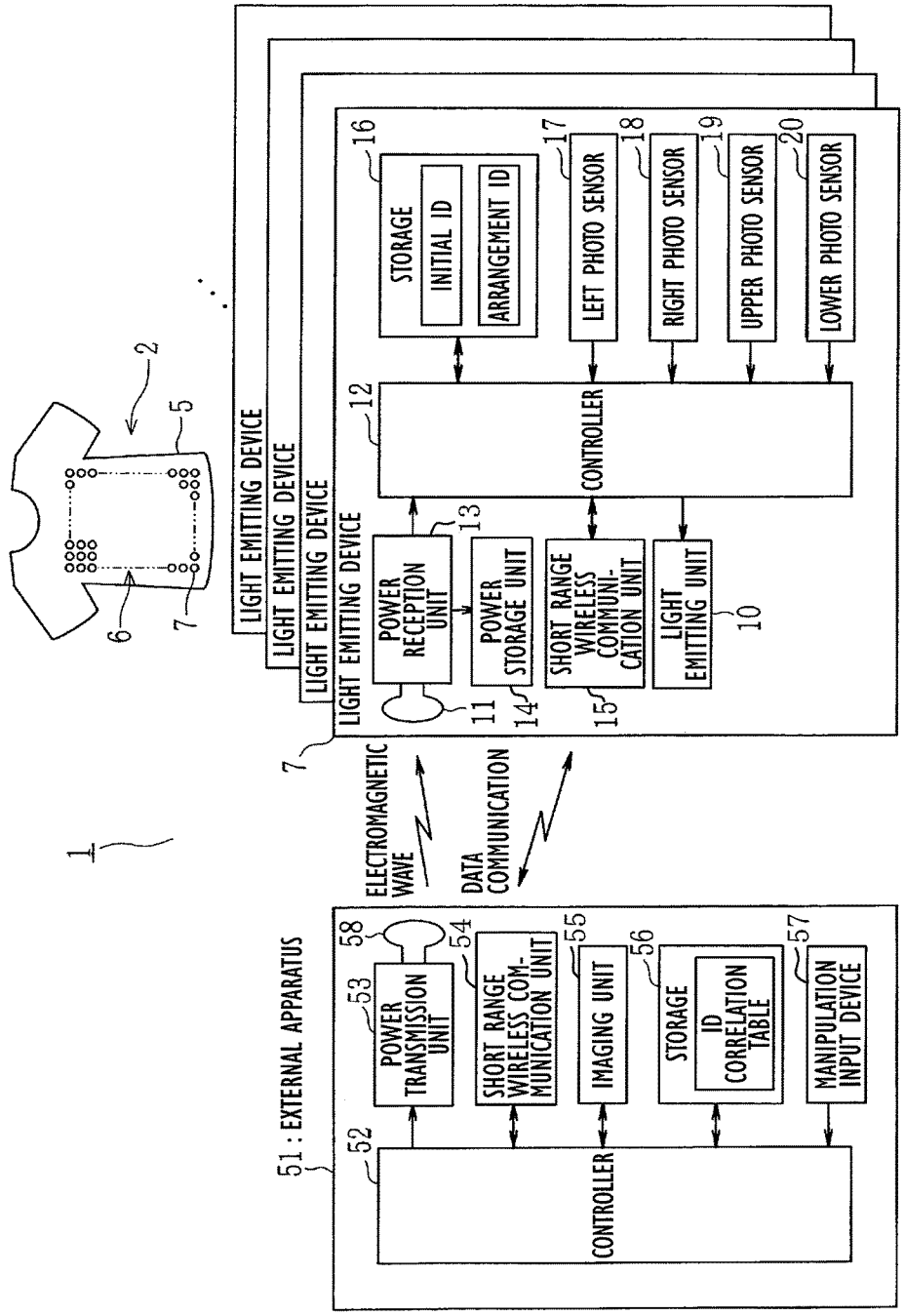
FIG. 9 is a functional block diagram illustrating a configuration of an external apparatus.

As shown in FIG. 9, the external apparatus 51 writes the arrangement ID into each light emitting device 7. The apparatus 51 may be a mobile apparatus such as a mobile phone or a personal digital assistant device that is portable by a user or may be a specific purpose apparatus prepared for writing the arrangement IDs. The external apparatus 51 includes a controller 52, a power transmission unit 53, a short range wireless communication unit 54, an imaging unit 55, a storage 56, and a manipulation input device 57. The controller 52 includes a known microcomputer having a CPU, ROM, RAM, and I/O bus. The controller 52 executes computer programs stored in the ROM to control the entire operations of the external apparatus 51, such as power transmission and data communication.

The power transmission unit 53 includes a power transmission coil 58 and a power transmission capacitor (not shown) to wirelessly charge (non-contact charge) the power reception units 13 of the above light emitting devices 7 by a radio wave reception method. The short range wireless communication unit 54 communicates with the short range wireless communication unit 15 of each light emitting device 7 by short range wireless communication. The imaging unit 55 includes a CCD (Charge Coupled Device) sensor and a CMOS (Complementary Metal Oxide Semiconductor) sensor. The imaging unit 55 takes an image of the overall light emitting device group 6 from the front, and outputs the acquired image to the controller 52. The storage 56 stores an ID correlation table to identify a correlation between the initial ID and arrangement ID of each light emitting device 7. The manipulation input section 57 receives command input manipulations performed by the user, and outputs the received command input manipulation to the controller 52.

As described above, after configuring the light emitting device group 6 by combining the multiple light emitting devices 7 in two-dimensional arrangement (and the initial ID is arranged at random), the arrangement ID needs to be set to each of the two-dimensionally combined light emitting devices 7. In this case, the arrangement ID is set after correct identification of the position of each light emitting device 7. In some cases, the position of each light emitting device 7 may not be correctly identified due to the pixel size (of the light emitting unit 10 of the light emitting device 7) and the image taking capability of the imaging unit 55. That is, when the pixel size is relatively large or the image taking capability of the imaging unit 55 is relatively high, the two-dimensional position of each light emitting device 7 can be identified correctly. On the contrary, when the pixel size is relatively small or the image taking capability of the imaging unit 55 is relatively low, the two-dimensional position of each light emitting device 7 cannot be identified correctly.

The following will describe an arrangement ID setting performed in a case where the position of each light emitting device 7 cannot be correctly identified (first arrangement ID setting) and an arrangement ID setting performed in a case where the position of each light emitting device 7 can be correctly identified (second arrangement ID setting).

(1) First Arrangement ID Setting

In the first arrangement ID setting, the position of one of the multiple light emitting devices 7 is set as a reference position. Then, relative positions to the reference position are found to set arrangement IDs for all of the light emitting devices 7. In the first arrangement ID setting, the reference position setting for setting the reference position and the arrangement ID setting performed based on the reference position are performed.

(1-1) Reference Position Setting

Figure 10:
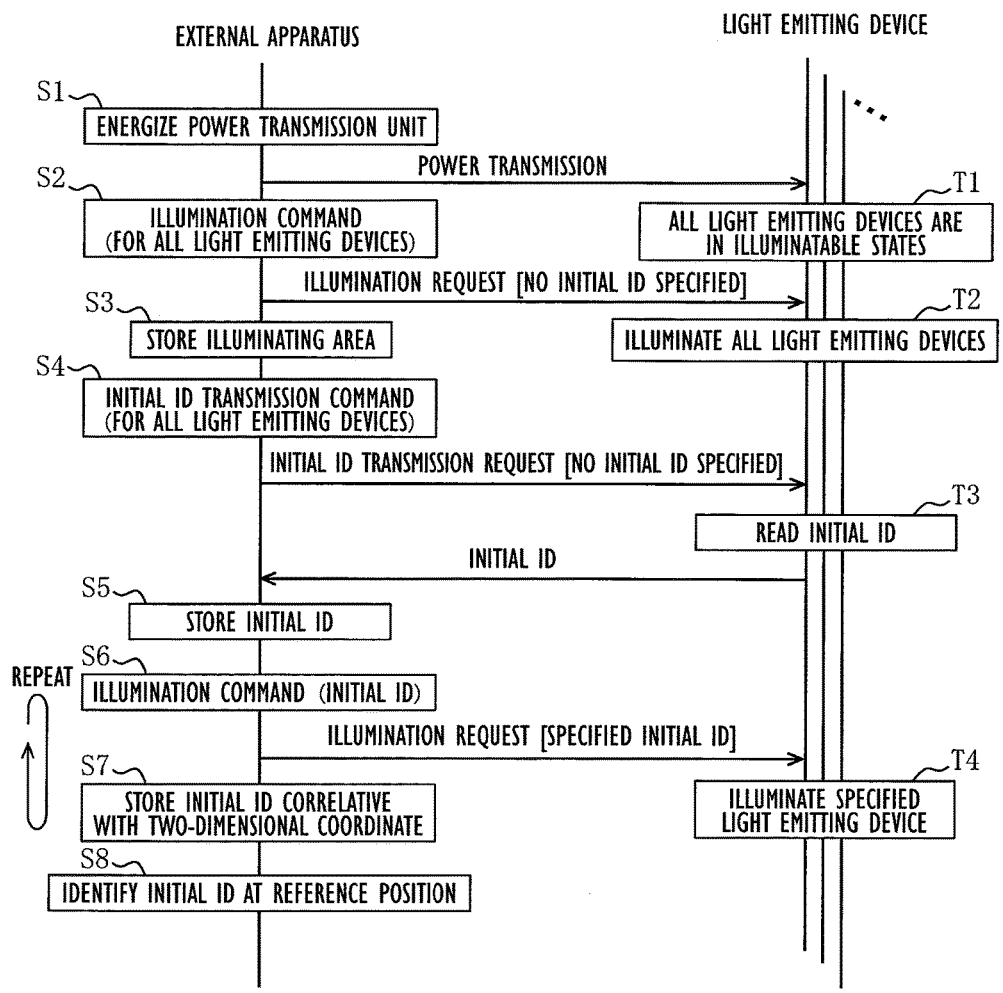
FIG. 10 is a sequence diagram showing a reference position setting performed in a first arrangement ID setting.

FIG. 10 is a sequence diagram of the reference position setting performed in the first arrangement ID setting. In the external apparatus 51, the controller 52 energizes the power transmission unit 53, and transmits electromagnetic waves from the power transmission unit 53 to all of the light emitting devices 7 to transmit power to all of the light emitting devices 7 (S1). Upon reception of the electromagnetic waves from the external apparatus 51, each light emitting device 7 generates power to illuminate the light emitting unit 10 (T1). Next, the controller 52 outputs an illumination command for all of the light emitting devices 7 to the short range wireless communication unit 54, and the short range wireless communication unit 54 transmits an illumination request (with no specified initial ID) to all of the light emitting devices 7 (S2).

In each light emitting device 7, upon reception of the illumination request (no initial ID specified) transmitted from the external apparatus 51, the controller 12 illuminates the light emitting unit 10 in response to the received illumination request (T2). In this case, since the illumination command is directed to all of the light emitting devices 7, the light emitting units 10 of all of the light emitting devices 7 are illuminated.

In the external apparatus 51, the controller 52 activates the imaging unit 55 when the light emitting units 10 of all of the light emitting devices 7 are illuminated, and takes an image of the overall light emitting device group 6 by using the imaging unit 55. The controller 52 analyzes the image taken by the imaging unit 55 to identify, as an illuminating area, the area where the light emitting units 10 of all of the light emitting devices 7 are located. The controller 52 stores the identified illuminating area into the storage 56 as the two-dimensional coordinate (S3). In this case, when the two-dimensional position of each light emitting device 7 cannot be correctly identified because of the relatively small pixel size or the relatively low image taking capability of the imaging unit 55, the two-dimensional coordinates in the illuminating area indicate approximate (low-accuracy) coordinates, which do not follow a regular order. The controller 52 outputs an initial ID transmission command for all of the light emitting devices 7 to the short range wireless communication unit 54, and the short range wireless communication unit 54 transmits an initial ID transmission request (no initial ID specified) to all of the light emitting devices 7 (S4).

In each light emitting device 7, when the short range wireless communication unit 15 receives the initial ID transmission request (no initial ID specified) transmitted from the external apparatus 51, the controller 12 outputs a read command to the storage 16 to read the initial ID from the storage 16 (T3), and transmits the read-out initial ID from the short range wireless communication unit 15 to the external apparatus 51. In this case, all of the light emitting devices 7 transmit the initial IDs, respectively.

In the external apparatus 51, the controller 52 receives the initial IDs transmitted from all of the light emitting devices 7 through the wireless communication unit 25 and stores the received initial IDs in the storage 56. That is, the controller 52 stores the initial IDs corresponding to the number of all of the light emitting devices 7 included in the light emitting device group 6 into the storage 56 (S5). The controller 52 reads the initial IDs stored in the storage 56 one by one, outputs the illumination command for each read-out initial ID to the short range wireless communication unit 54, and the short range wireless communication unit 54 transmits the illumination command (with specified initial ID) to the light emitting device 7 (S6).

In each light emitting device 7, the controller 12 receives, through the short range wireless communication unit 15, the illumination command (with specified initial ID) transmitted from the external apparatus 51 (T4), and then illuminates the light emitting unit 10 in response to the received illumination command. In this case, only the light emitting unit 10 of the light emitting device 7 having an initial ID identical to the specified initial ID is illuminated. That is, the controller 12 compares the initial ID specified in the received illumination command with the own initial ID. When the specified initial ID is identical to the own initial ID, the controller 12 illuminates the light emitting unit 10. When the specified initial ID is different from the own initial ID, the controller 12 does not illuminate the light emitting unit 10.

In the external apparatus 51, when the light emitting unit 10 of the specified light emitting device 7 is being illuminated, the controller 52 analyzes the image taken by the imaging unit 55 to identify the position of the light emitting device 7 having the light emitting unit 10 that is illuminated. Then, as illustrated in FIG. 11, the controller 52 correlates the initial ID with a two-dimensional coordinate ($x_{am}$ (m is the natural number),$y_{an}$ (n is the natural number)) (S7). The controller 52 repeatedly executes the above procedure to all of the initial IDs. Thus, all of the initial IDs can be correlated with two-dimensional coordinates. The coordinates correlated with all of the initial IDs are approximate coordinates as described above, and do not follow a regular order. Therefore, the regular order needs to be set.

After associating all of the initial IDs with the two-dimensional coordinates, the controller 52 identifies the initial ID of the light emitting device 7 located at the reference position (S8). That is, when an upper left position in the light emitting device group 6 viewed from the front is set as the reference position, the controller 52 identifies, among the multiple two-dimensional coordinates respectively correlated with all of the initial IDs, one two-dimensional coordinate having the leftmost coordinate and the uppermost coordinate, and identifies the initial ID correlated with the leftmost and uppermost two-dimensional coordinate as the initial ID of the reference position. The two-dimensional coordinate of the upper left position is a combination of a minimum x-coordinate among the x-coordinates correlated with all of the initial IDs and a minimum y-coordinate among the y-coordinates correlated with all of the initial IDs. When the minimum x-coordinate is "1" and the minimum y-coordinate is "1," the two-dimensional coordinate of the upper left position is (1,1).

(1-2) Arrangement ID Setting Based on Reference Position

Figure 12:
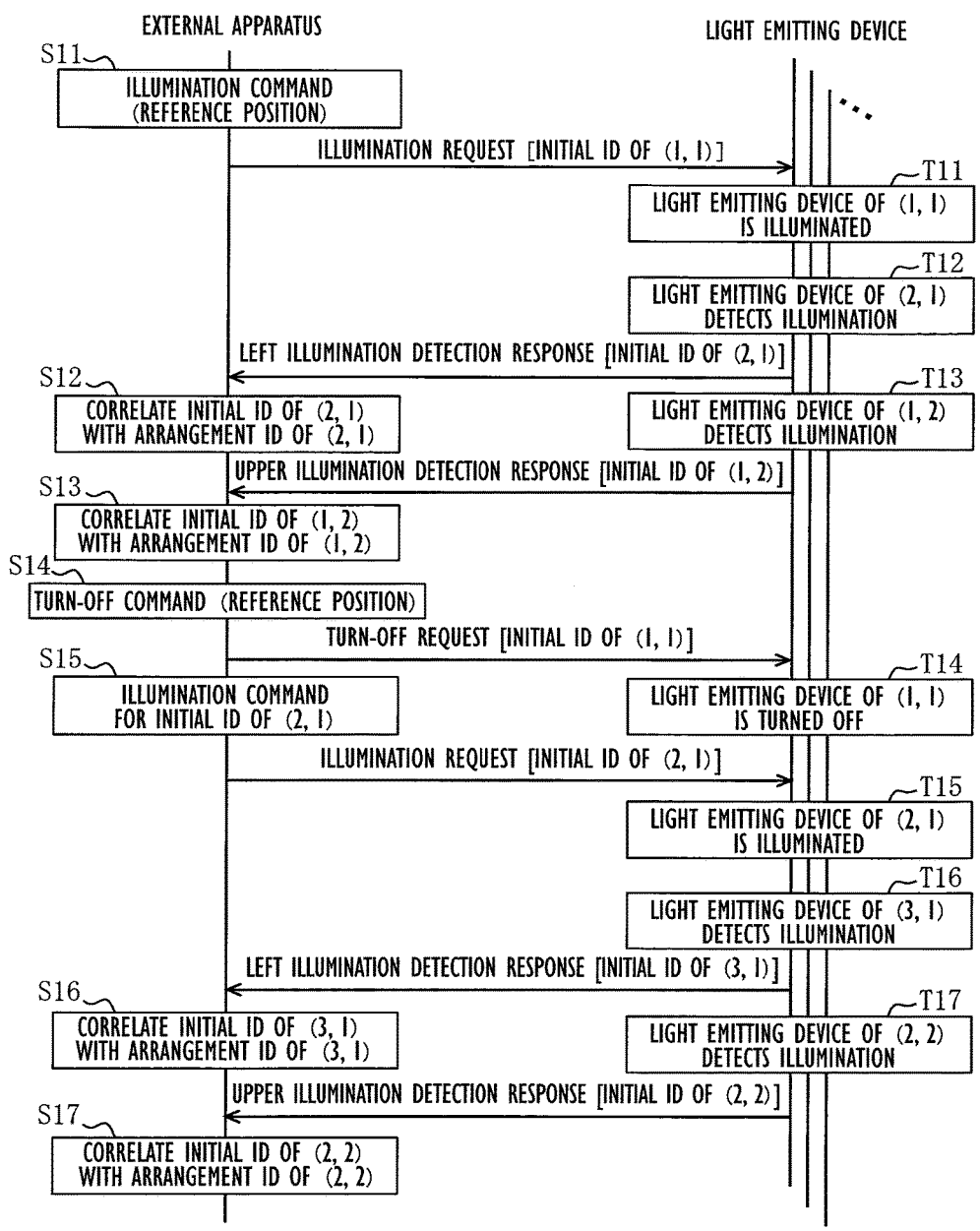
FIG. 12 is a sequence diagram (first part) showing an arrangement ID setting performed in the first arrangement ID setting on the basis of the reference position.
Figure 13:
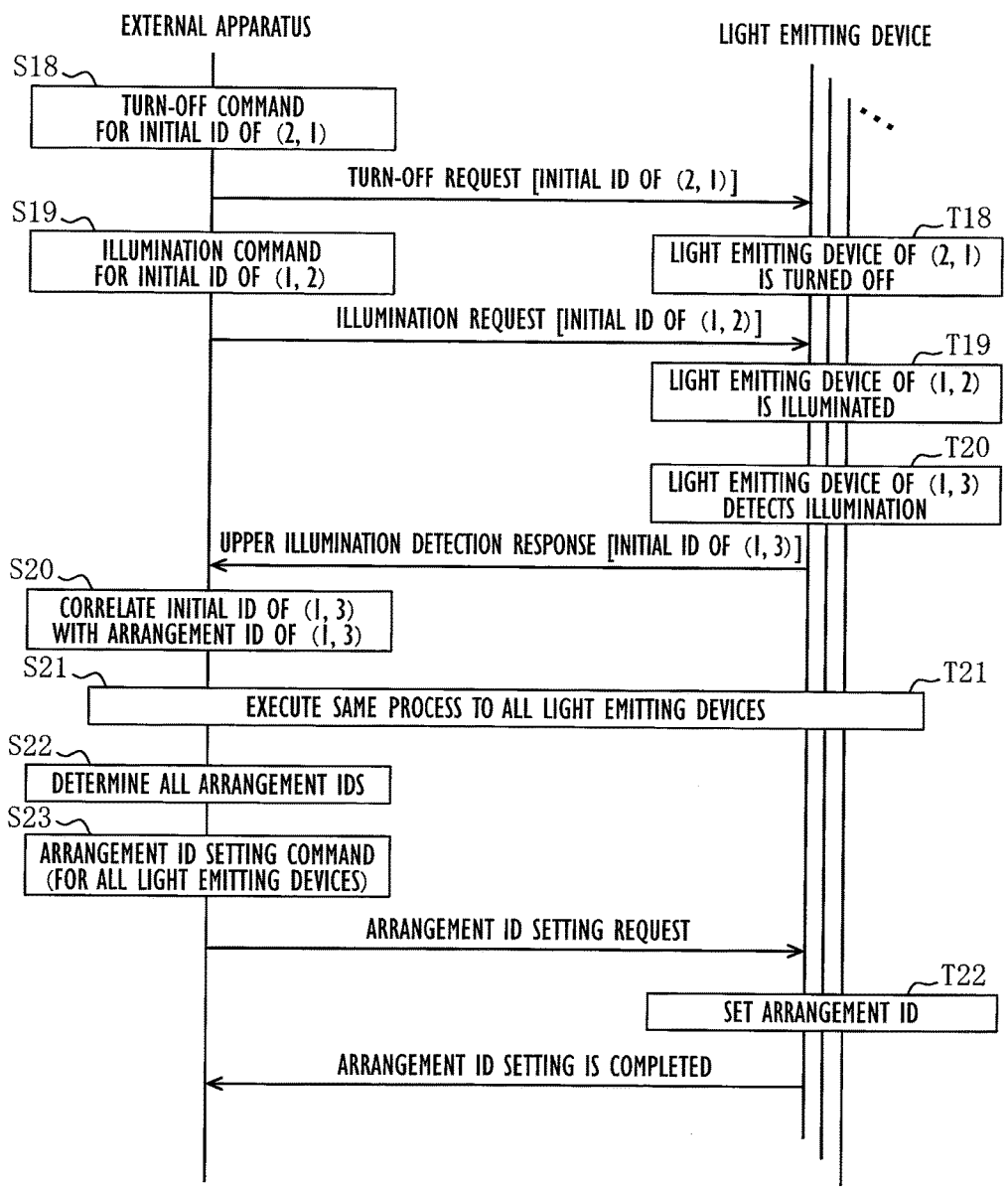
FIG. 13 is a sequence diagram (second part) showing an arrangement ID setting performed in the first arrangement ID setting on the basis of the reference position.

FIGS. 12 and 13 are sequence diagrams of the arrangement ID setting based on the identified reference position. In the external apparatus 51, when the two-dimensional coordinate of the reference position is set to (1,1) as described above, the controller 52 outputs the illumination command for the light emitting device 7 at the two-dimensional coordinate of the reference position (1,1) to the short range wireless communication unit 54, and the short range wireless communication unit 54 transmits the illumination command (with initial ID of (1,1)) to the corresponding light emitting device 7 (S11).

In each of the light emitting devices 7, the controller 12 receives, through the short range wireless communication unit 15, the illumination request (with initial ID of (1,1)) transmitted from the external apparatus 51 and illuminates the light emitting unit 10 in response to the received illumination command (T11). In this case, only the light emitting unit 10 of the light emitting device 7 located at the coordinate (1,1) of the reference position emits light, and the light emitting units 10 of remaining light emitting devices 7 do not illuminate.

When the light emitting unit 10 of the light emitting device 7 located at the reference position having the coordinate of (1,1) is illuminated as described above, the light emitting devices 7 adjacent to the light emitting device 7 located at the reference position having the coordinate of (1,1) detect the illumination of the light emitting device located at the reference position. That is, the light emitting device 7, which is located on the right side of the light emitting device 7 located at the coordinate (1,1) when viewed from the front, detects the illumination by the left photo sensor 17 (T12). Then, the light emitting device 7, which has detected the illumination of the light emitting device 7 located at the coordinate (1,1), transmits the own initial ID as a left illumination detection response (with initial ID of (2,1)). The left illumination detection response indicates that that the light emitting device 7 that has detected the illumination of the light emitting device located at the reference position is located at the coordinate (2,1). Herein, the coordinate of (2,1) is on the right side of the coordinate (1,1) at which the illuminated light emitting device 7 is located. The light emitting device 7, which is located below the light emitting device 7 located at the coordinate (1,1) when viewed from the front, also detects the illumination of the light emitting device 7 located at the coordinate (1,1) by the upper photo sensor 19 (T13). The light emitting device 7, which has detected the illumination of the light emitting device 7 located at the coordinate (1,1), transmits the own initial ID as an upper illumination detection response (with initial ID of (1,2)). The upper illumination detection response indicates that the light emitting device 7 that has detected the illumination of the light emitting device 7 located at the coordinate (1,1) is located at the coordinate of (1,2) immediately below the coordinate (1,1) corresponding to the illuminated light emitting device 7.

In the external apparatus 51, upon reception of the left illumination detection response (with initial ID of (2,1)) transmitted from the light emitting device 7 through the short range wireless communication unit 54, the controller 52 correlates the received initial ID of the light emitting device 7 with the arrangement ID (2, 1) (S12). Upon reception of the upper illumination detection response (with initial ID of (1,2)) transmitted from the light emitting device 7 through the short range wireless communication unit 54, the controller 52 correlates the received initial ID of the light emitting device 7 with the arrangement ID (1, 2) (S13). Next, the controller 52 outputs the turn-off command for the light emitting device 7, which has been illuminated and is located at the reference position (1,1), to the short range wireless communication unit 54, and the short range wireless communication unit 54 transmits a turn-off request (with initial ID of (1,1)) to all of the light emitting devices 7 (S14).

In each light emitting device 7, upon reception of the turn-off request (with initial ID of (1,1)) transmitted from the external apparatus 51 through the short range wireless communication unit 15, the controller 12 turns off the light emitting unit 10 in response to the received turn-off command (T14). In this case, only the light emitting unit 10 of the light emitting device 7 located at the coordinate of the reference position (1,1) turns off the light emitting.

In the external apparatus 51, the controller 52 outputs the illumination command for the light emitting device 7 of (2, 1), which is correlated with the arrangement ID (2, 1), to the short range wireless communication unit 54, and the short range wireless communication unit 54 transmits the illumination request (with initial ID of (2,1)) to the light emitting device 7 (S15). In this case, the light emitting unit 10 of the light emitting device 7 located at the coordinate (2,1) emits light (T15). Then, a light emitting device 3 located on the right side of the light emitting device 7 located at the coordinate (2,1) when viewed from the front detects the illumination of adjacent light emitting device 7 through the left photo sensor 17 (T16) and transmits a left illumination detection response (with initial ID of (3,1)). The light emitting device 7, which is located below the light emitting device 7 located at the coordinate (2,1) when viewed from the front, detects the illumination of adjacent light emitting device 7 through the upper photo sensor 19 (T17), and transmits an upper illumination detection response (with initial ID of (2,2)).

In the external apparatus 51, upon reception of the left illumination detection response (with initial ID of (3,1)) transmitted from the light emitting device 7 through the short range wireless communication unit 54, the controller 52 correlates the received initial ID of the light emitting device 7 with the arrangement ID (3, 1) (S16). Upon reception of the upper illumination detection response (with initial ID of (2,2)) transmitted from the light emitting device 7 through the short range wireless communication unit 54, the controller 52 correlates the received initial ID of the light emitting device 7 with the arrangement ID (2, 2) (S17). Next, the controller 52 outputs the turn-off command for the light emitting device 7 of (2,1), which has been illuminated, to the short range wireless communication unit 54, and the short range wireless communication unit 54 transmits a turn-off request (with initial ID of (2,1)) to the light emitting device 7 (S18). In this case, the light emitting unit 10 of the light emitting device 7 positioned at the coordinate (2,1) stops emitting light (T18).

In the external apparatus 51, the controller 52 outputs the illumination command for the light emitting device 7 of (1,2), which is correlated with the arrangement ID (1, 2), to the short range wireless communication unit 54, and the short range wireless communication unit 54 transmits the illumination request (with initial ID of (1, 2)) to the light emitting device 7 (S19). In this case, the light emitting unit 10 of the light emitting device 7 located at the coordinate (1,2) emits light (T19). Then, the light emitting device 3 located below the light emitting device 7, which is located at the coordinate (1,2) when viewed from the front, detects the illumination through the upper photo sensor 19 (T20), and transmits an upper illumination detection response (with initial ID of (1,3)).

In the external apparatus 51, upon reception of the upper illumination detection response (with initial ID of (1,3)) transmitted from the light emitting device 7 through the short range wireless communication unit 54, the controller 52 correlates the received initial ID of the light emitting device 7 with the arrangement ID (1, 3) (S12).

After that, as illustrated in FIG. 14A, FIG. 14B, and FIG. 14C in described order, the controller 52 sequentially controls the illumination and turn-off of the remaining light emitting devices 7 from the reference position toward both the horizontal direction and vertical direction to execute the same procedure (S21, T21). Then, as illustrated in FIG. 15, the controller 52 correlates the initial IDs of all of the light emitting devices 7 with the arrangement IDs to determine the arrangement IDs for all of the light emitting devices 7. After the determination of the arrangement IDs for all of the light emitting devices 7, the controller 52 outputs an arrangement ID setting command for all of the light emitting devices 7 to the short range wireless communication unit 54, and the short range wireless communication unit 54 transmits an arrangement ID setting request to all of the light emitting devices 7 (S23).

In each light emitting device 7, upon reception of the arrangement ID setting request transmitted from the external apparatus 51 through the short range wireless communication unit 15, the controller 12 sets the arrangement ID in response to the received arrangement ID setting request (T22). That is, the controller 12 identifies the arrangement ID correlated with the own initial ID to set the identified arrangement ID. After the setting of the arrangement ID, the controller 12 transmits an arrangement ID setting completion signal from the short range wireless communication unit 15 to the external apparatus 51.

Through a series of the above-described process, even when the two-dimensional position of each light emitting device 7 is not identifiable correctly, the arrangement ID can be set for each light emitting device 7. In this case, the x-coordinates and y-coordinates that form the arrangement IDs are in the ascending order on the basis of the reference position (1,1). As described above, the uppermost and leftmost position among all of the two-dimensional coordinates correlated with all of the initial IDs has been set as the reference position. For another example, a position other than the uppermost and leftmost position may be set as the reference position. As another example, the controls of the illumination and turning off of the illuminated light emitting devices 7 from the reference position may be carried out along the horizontal direction in order.

(2) Second Arrangement ID Setting

In the second arrangement ID setting, unlike the above first arrangement ID setting, absolute positions are found to set the arrangement IDs for all of the light emitting devices 7 without setting the reference position.

Figure 16:
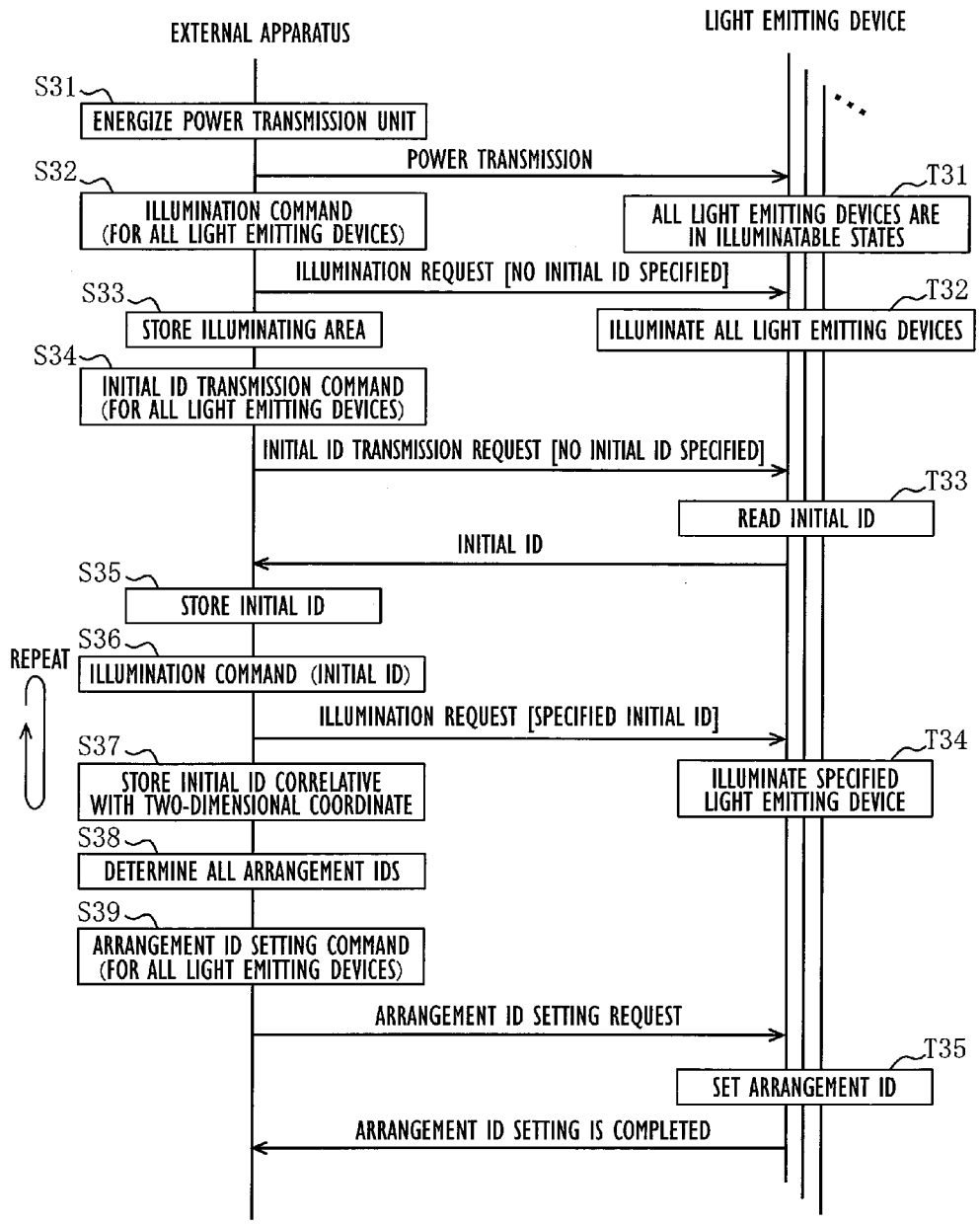
FIG. 16 is a diagram showing a sequence diagram of a second arrangement ID setting.

As illustrated in FIG. 16, in the second arrangement ID setting, the external apparatus 51 performs S31 to S37 which are similar to S1 to S7 described in the above "(1) First Arrangement ID Setting,". Each light emitting device 7 performs T31 to T34 which are similar to T1 to T4 described in the above "(1) First Arrangement ID Setting". As illustrated in FIG. 17, in the second ID arrangement ID setting, the controller 52 correlates the initial IDs with two-dimensional coordinates ($x_{bm}$ (m is a natural number)),$y_{bn}$ (n is a natural number)). Unlike the two-dimensional coordinates ($x_{am}$,$y_{an}$) described in (1) First Arrangement ID Setting, the two-dimensional coordinates ($x_{bm}$, $y_{bn}$) in second arrangement ID setting are not approximate coordinates, but are coordinates following a regular order or a predetermined rule. Therefore, the controller 52 can directly divert the two-dimensional coordinates correlated with all of the initial IDs to the arrangements ID to determine the arrangements ID for all of the light emitting devices 7 (S38). The controller 52 outputs the arrangement ID setting command for all of the light emitting devices 7 to the short range wireless communication unit 54, and the short range wireless communication unit 54 transmits the arrangement ID setting request to all of the light emitting devices 7 (S39).

In each light emitting device 7, upon reception of the arrangement ID setting request transmitted from the external apparatus 51 through the short range wireless communication unit 15, the controller 12 sets the arrangement ID in response to the received arrangement ID setting request (T35). That is, the controller 12 identifies the arrangement ID correlated with the own initial ID to set the identified arrangement ID. After the setting of the arrangement ID, the controller 12 transmits an arrangement ID setting completion signal from the short range wireless communication unit 15 to the external apparatus 51.

With the above-described series of process, when the two-dimensional position of each light emitting device 7 is correctly identifiable, the arrangement ID can be set to each light emitting device 7 without setting the reference position as described in first arrangement ID setting.

The following will describe an operation switch between the flash or illumination mode and the turn-off mode of each light emitting device 7 with reference to FIGS. 18 to 21. Before this operation switch, suppose that the arrangement ID has been set to each light emitting device 7 through the above-described first arrangement ID setting or the second arrangement ID setting. The light emitting devices 7 may operate individually (FIG. 18) or may operate in cooperation with others as a group (FIG. 19), to switch between the flash or illumination mode and the turn-off mode. Here, each operation is explained sequentially.

(1) Individual Operation

Figure 18:
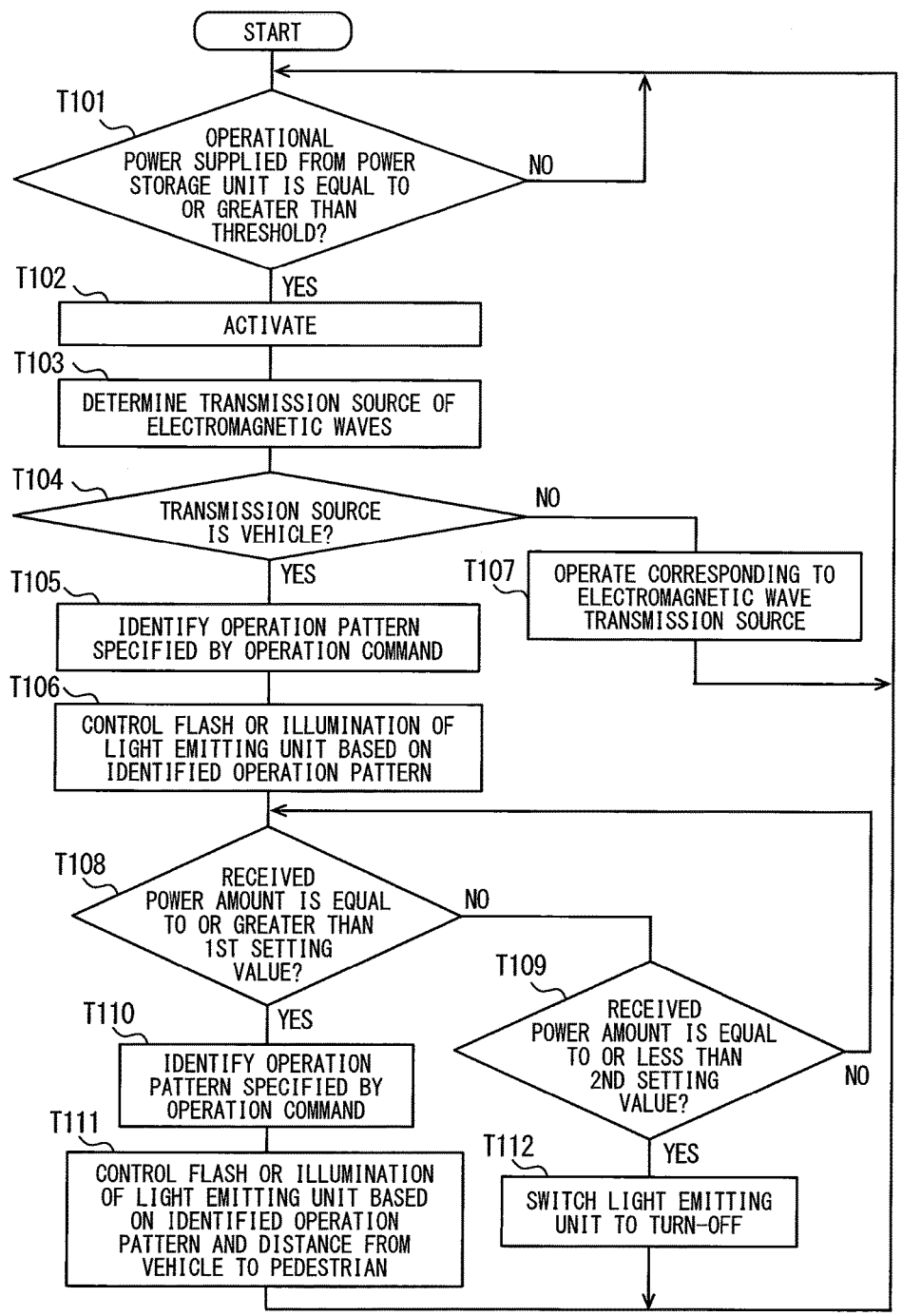
FIG. 18 is a flowchart showing an operation performed when the light emitting devices operate individually.

In the individual operation, all of the light emitting devices 7 attached to the light emitting garment 2 perform the same operation. When the vehicle 3 equipped with the vehicular apparatus 4 approaches a pedestrian wearing the light emitting garment 2 within a power transmission distance of an electromagnetic wave transmitted from the power transmission unit 21, each light emitting device 7 receives the electromagnetic wave transmitted from the power transmission unit 21 through the power reception unit 13. Upon reception of the electromagnetic wave transmitted from the power transmission unit 21, the power reception unit 13 rectifies the received electromagnetic wave and transforms the wave to direct-current current to generate power, demodulates the wave to detect the activation signal, and outputs the activation signal to the controller 12. The power storage unit 14 stores the power (reception power) generated by the power reception unit 13, and supplies the stored power to each functional block as the operational power of the light emitting device 7. As illustrated in FIG. 18, the controller 12 is activated (T102) when the activation signal is inputted from the power reception unit 13 and when the operational power supplied from the power storage unit 14 becomes equal to or more than a threshold (T101). The power storage unit 14 continues storing the power generated by the power reception unit 13 during reception of the electromagnetic waves transmitted from the power transmission unit 21 through the power reception unit 13 (continues wireless charging).

In each light emitting device 7, the controller 12, after activation, extracts a power transmission source ID from the electromagnetic wave received by the power reception unit 13 to specify the power transmission source ID, and specifies the power transmission source of the electromagnetic wave (T103). Here, when determining that the electromagnetic wave received by the power reception unit 13 is transmitted from the vehicular apparatus 4 equipped to the vehicle 3 and the transmission source of the electromagnetic wave is the vehicle (the power transmission unit 21 of the vehicle 3) (T104: YES), the controller 12 identifies an operation command in the activation signal inputted from the power reception unit 13 to identify an operation pattern specified by the operation command (T105). The controller 12 controls the flash or illumination of the light emitting unit 10 on the basis of the identified operation pattern (T106). The controller 12 flashes the light emitting unit 10 at a first flash frequency when the operation pattern identified by the operation command indicates a command to flash at the first flash frequency.

When determining that the electromagnetic wave received by the power reception unit 13 is transmitted from a source other than the vehicular apparatus 4 (a machine on a street) and a transmission source of the electromagnetic wave is other than the vehicle 3 (the power transmission unit 21 of the vehicle 3) (T104: NO), the controller 12 operates based on the transmission source of the electromagnetic wave (T107).

After starting the flash or illumination of the light emitting unit 10 on the basis of the identified operation pattern, the controller 12 determines whether the amount of power (reception power) generated by the power reception unit 13 becomes equal to or more than a predetermined first setting value, and then determines whether the amount of power becomes equal to or less than a predetermined second setting value (the second setting value is less than the first setting value) (T108, T109). When the vehicle 3 equipped with the vehicular apparatus 4 further approaches the pedestrian who wears the light emitting garment 2, the amount of reception power increases. When the vehicle 3 departs from the pedestrian, the amount of reception power is reduced.

Upon a determination that the amount of reception power has become equal to or more than the first setting value caused by the further approach of the vehicle 3 to the pedestrian (T108: YES), the controller 12 identifies the operation command in the activation signal inputted from the power reception unit 13 to identify the operation pattern specified by the operation command (T110). In this case, the controller 12 controls the flash or illumination of the light emitting unit 10 on the basis of the identified operation pattern and in response to a distance from the vehicle to the pedestrian (T111). The controller 12 flashes the light emitting unit 10 at the second flash frequency when the operation pattern identified by the operation command indicates a command to flash the light emitting unit 10 at the second flash frequency higher than the first flash frequency (the first flash frequency is switched to the second flash frequency). In this case, the controller 12 may further change the flash frequency in response to the distance to the pedestrian. Upon a determination that the amount of reception power has become equal to or less than the second setting value due to the departing of the vehicle 3 from the pedestrian (T109: YES), the controller 12 switches the light emitting unit 10 from the flash or illumination mode to turn-off mode (T112).

Through a series of the above process, when the vehicle 3 equipped with the vehicular apparatus 4 approaches the pedestrian who wears the light emitting garment 2, the light emitting devices attached to the light emitting garment 2 which the pedestrian wears are activated to flash or illuminate. Accordingly, a driver can recognize the existence of the pedestrian, and the pedestrian's safety can be ensured. The pedestrian can be ensured with the sense of security by notifying of own existence to the driver so that the driver can recognize the existence of pedestrian. In this case, since the electromagnetic waves received from the vehicular apparatus 4 are used as the operational power for operating the light emitting devices 7, there is no need to provide a power source (rechargeable battery) to the light emitting garment 2 for supplying operational power to the light emitting devices 7. The above has illustrated the aspect in which the flash frequency is switched in response to the change of the distance from the vehicle 3 to the pedestrian. As another example, the color of the flash may be changed (from the yellow flash to red flash) in response to the change of the distance from the vehicle 3 to the pedestrian. As another example, both the flash frequency and flash color may be changed together.

(2) Group Operation in Cooperation with Others

Figure 19:
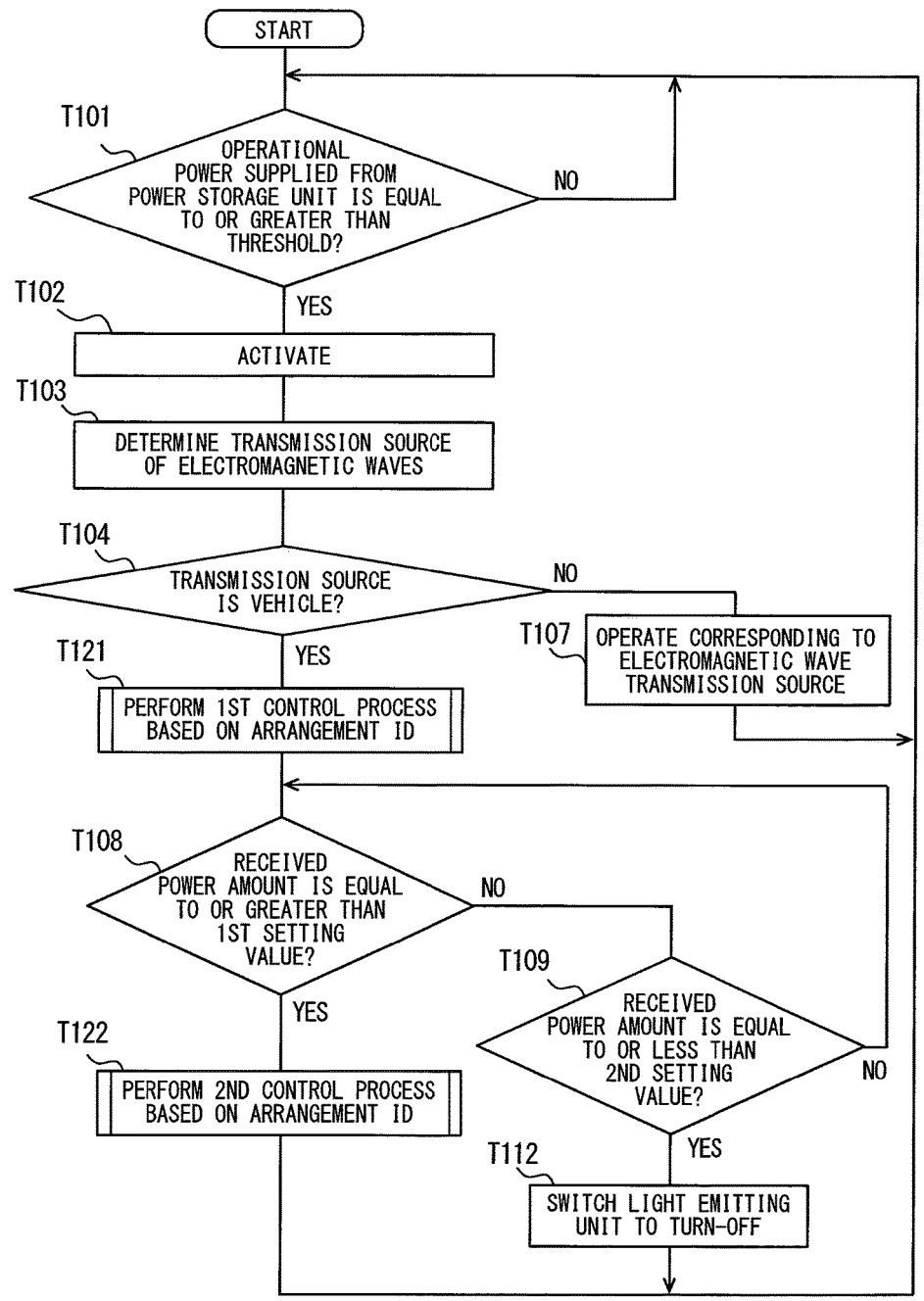
FIG. 19 is a flowchart showing an operation performed when the light emitting devices operate individually.

In case of group operation, all of the light emitting devices 7 attached to the light emitting garment 2 perform the flash or illumination different from one another. In group operation, only the specified light emitting devices 7 perform the flash or illumination. Herein, the specified light emitting devices 7 are defined by the arrangement ID operates. In this case, in each light emitting device 7, as illustrated in FIG. 19, upon a determination that the transmission source of the electromagnetic wave is the vehicle 3 (the power transmission unit 21 of the vehicle 3) (T104: YES), the controller 12 proceeds to a first control based on the arrangement ID (T121).

Figure 20:
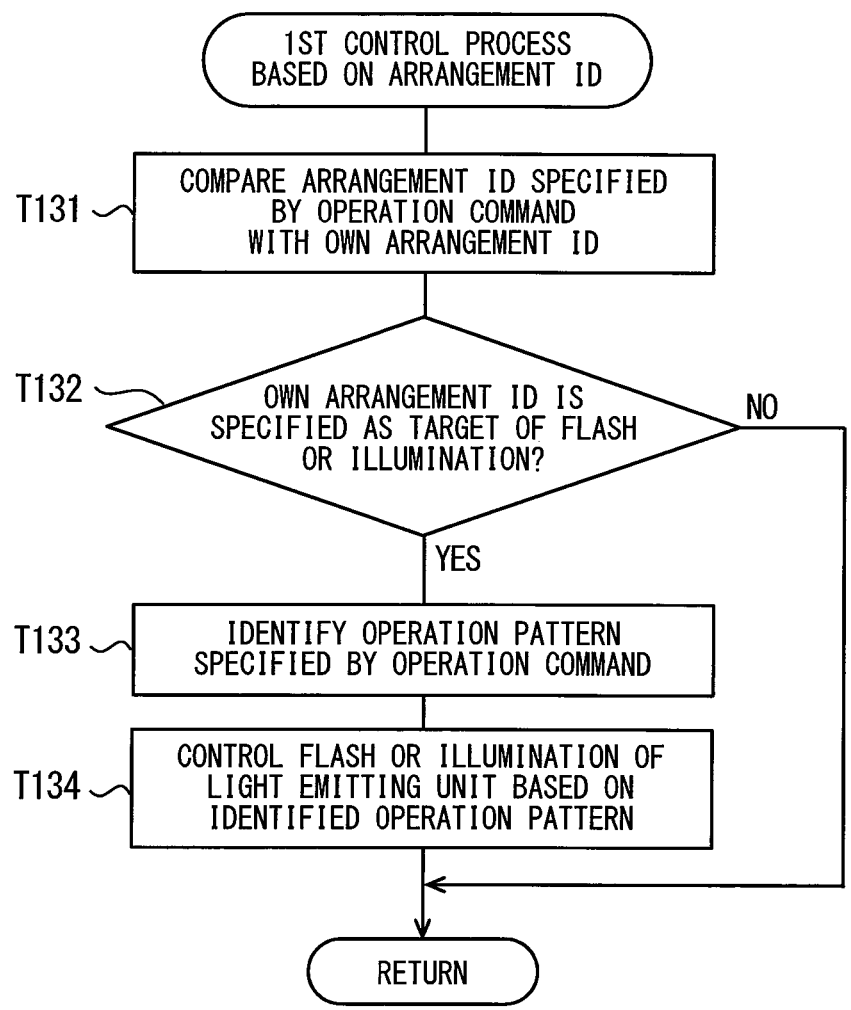
FIG. 20 is a flowchart showing a first control performed based on the arrangement ID in case of the individual operation.

As illustrated in FIG. 20, after shifting to the first control based on the arrangement ID, the controller 12 identifies the operation command in the activation signal inputted from the power reception unit 13, compares the arrangement ID specified by the identified operation command with the own arrangement ID (T131), and determines whether the own arrangement ID has been specified as a target of flash or illumination operation (T132). Upon a determination that the own arrangement ID has been specified as a target of flash or illumination operation (T132: YES), the controller 12 identifies the operation pattern specified by the operation command (T133) to control the flash or illumination operation of the light emitting unit 10 on the basis of the identified operation pattern (T134). On the contrary, upon a determination that the own arrangement ID has not been specified as a target of flash or illumination operation (T132: NO), the controller 12 does not control the flash or illumination operation of the light emitting unit 10.

Figure 21:
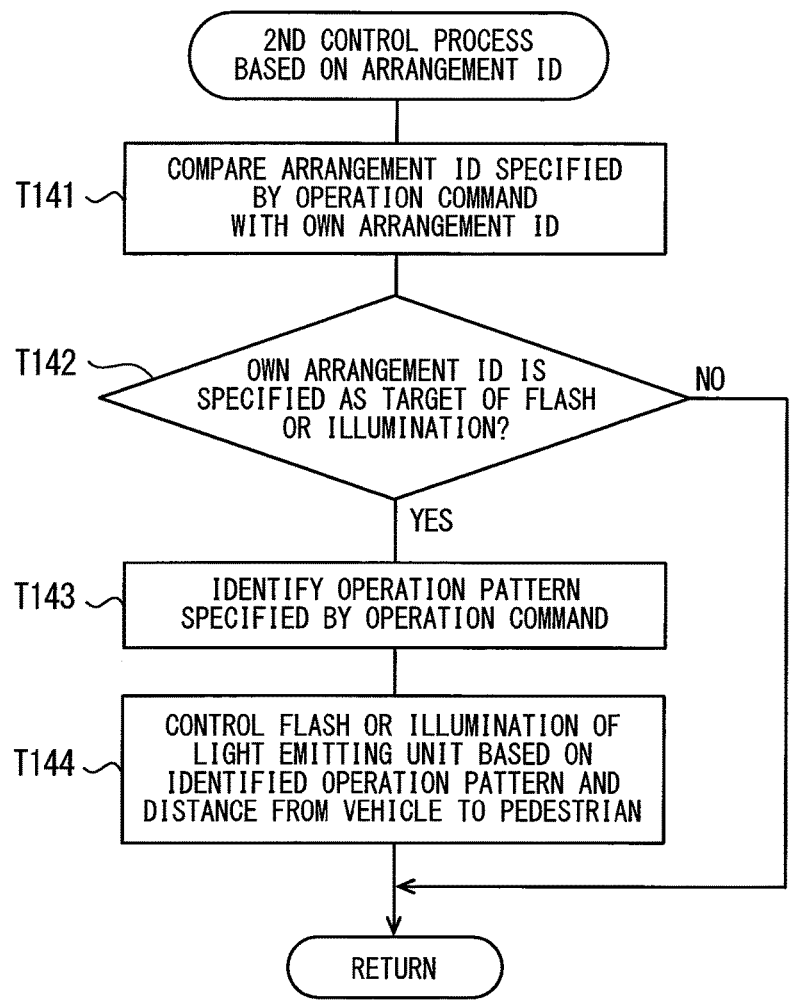
FIG. 21 is a flowchart showing a second control performed based on the arrangement ID in case of the individual operation.

Upon a determination that the amount of received power has become equal to or more than the first setting value when the vehicle 3 has further approached the pedestrian (T108: YES), the controller 12 proceeds to a second control based on the arrangement ID (T122). As illustrated in FIG. 21, after shifting to the second control based on the arrangement ID, the controller 12 identifies the operation command in the activation signal inputted from the power reception unit 13 similar to the first control, compares the arrangement ID specified by the identified operation command with the own the arrangement ID (T141), and determines whether the own arrangement ID has been specified as a target of flash or illumination operation (T142). Upon a determination that the own the arrangement ID has been specified as a target of flash or illumination operation (T142: YES), the controller 12 identifies the operation pattern specified by the operation command (T143) to control the flash or illumination operation of the light emitting unit 10 on the basis of the identified operation pattern and in response to the distance to the pedestrian (T144). On the contrary, upon a determination that the own arrangement ID has not been specified as a target of flash or illumination operation (T142: NO), the controller 12 does not control the flash or illumination operation of the light emitting unit 10.

Also in the above case, through the above series of processes, when the vehicle 3 equipped with the vehicular apparatus 4 approaches the pedestrian who wears the light emitting garment 2, the light emitting devices 7 of the light emitting garment 2 which pedestrian wears start flashing or illuminating. Thus, the driver can recognize the existence of the pedestrian, and the pedestrian's safety can be ensured properly. Unlike "(1) Individual Operation,", in "(2) Group Operation in Cooperation with Others", the arrangement IDs are specified to control the flash or illumination operations of the light emitting units 10 and to thus display specific information (characters or images). That is, the vehicular apparatus 4 previously stores the data about the arrangement IDs of the light emitting devices 7 (values and the number of the arrangement IDs). The operation command is generated based on the stored data and in response to the distance between the vehicle 3 and pedestrian. The electromagnetic wave including the generated operation command is transmitted in response to the distance between the vehicle 3 and pedestrian. Consequently, the specific information can be changed and displayed in response to the distance between the vehicle 3 and pedestrian.

Figure 22:
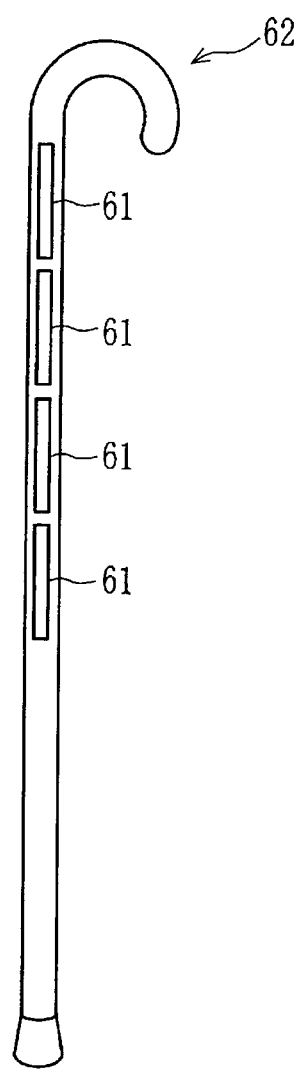
FIG. 22 is a diagram showing an example in which the light emitting devices are provided to a walking stick.
Figure 23:
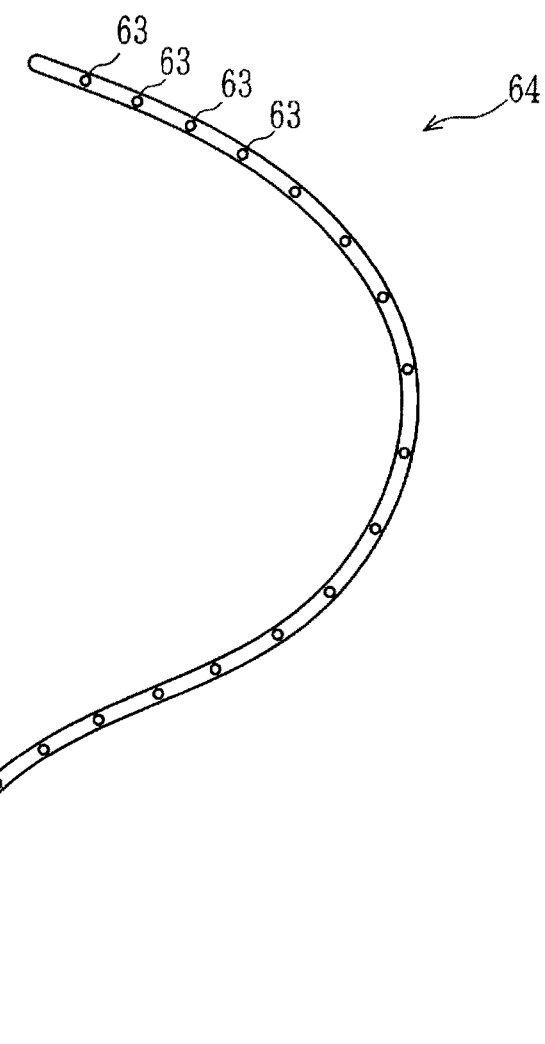
FIG. 23 is a diagram showing an example in which the light emitting devices are provided to a string.
Figure 24:
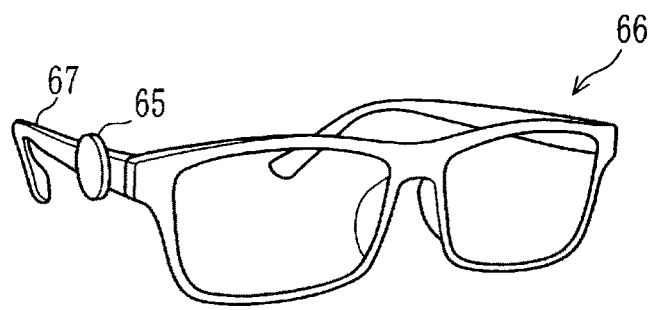
FIG. 24 is a diagram showing an example in which the light emitting devices are provided to glasses.

The light emitting devices 7 attached to the garment 5 have been described above. Any object or member wearable by a pedestrian may include the light emitting devices 7. In this case, the shape of the light emitting device may be changed according to the shape and size of the wearable member to include the light emitting devices. As illustrated in FIG. 22, light emitting devices 61 may be attached to a walking stick 62. As illustrated in FIG. 23, light emitting devices 63 may be attached to a string 64 (having flexibility) or a rope which the pedestrian wears. As illustrated in FIG. 24, a light emitting device 65 may be attached to a frame 67 of glasses 66. The light emitting device may be attached to accessories, such as a hat, shoes, a belt, earrings, pierced earrings, a necklace, bags or the like.

Figure 25:
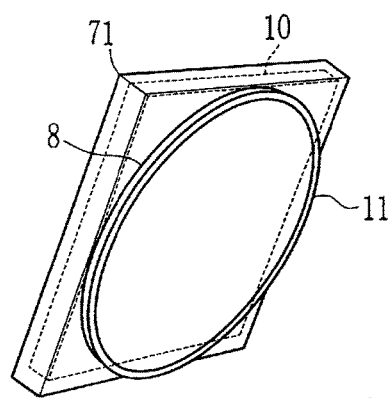
FIG. 25 is a diagram showing an exemplary shape of the light emitting device.
Figure 26:
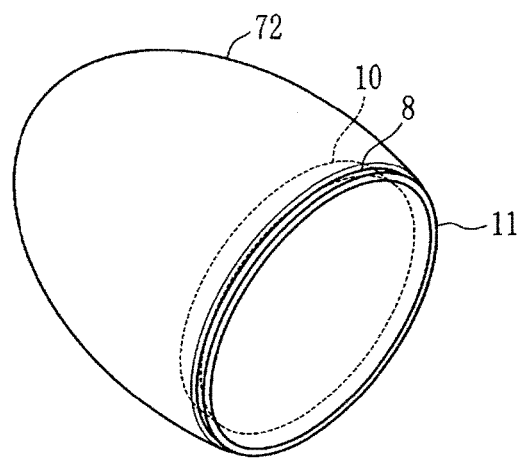
FIG. 26 is a diagram showing another exemplary shape of the light emitting device.
Figure 27:
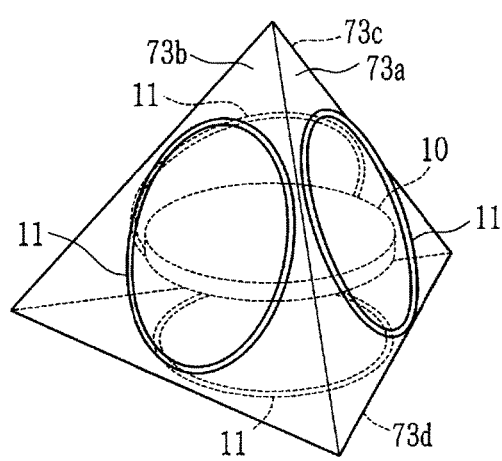
FIG. 27 is a diagram showing another exemplary shape of the light emitting device.

The light emitting device may have adjustable size and shape. As illustrated in FIG. 25, the light emitting device may be shaped by combining the circular, planar substrate 8 and a rectangular light guide plate 71. As illustrated in FIG. 26, the light emitting device may have an overall egg shape by combining the circular, plane substrate 8 and a hemispherical light guide plate 72. As illustrated in FIG. 27, the light emitting device may have an overall tetrahedron shape whose faces 73a to 73d each include the power reception coil 11. The configuration having the tetrahedron whose faces 73a to 73d each include the power reception coil 11 has higher reception sensitivity than the configuration in which the power reception coil 11 is provided to only one face.

According to the present embodiment described above, when the vehicle 3 equipped with the vehicular apparatus 4 approaches the pedestrian wearing the light emitting garment 2, and the electromagnetic waves transmitted from the power transmission unit 21 of the vehicular apparatus 4 are received by the power reception unit 13 of each light emitting device 7, the light emitting unit 10 starts flashing or illuminating. That is, the power source of the operational power for the light emitting devices 7 is disposed in the vehicle 3 instead of the light emitting garment 2 the pedestrian wears. This configuration can properly ensure the pedestrian's safety without disposing the power source on the pedestrian side. The pedestrian can also obtain the sense of security because the pedestrian can be notified of that the driver has recognized the pedestrian. Since the power source of the operational power for the light emitting devices 7 is not disposed in the garment 5, the size and weight of the garment 5 can be reduced, and the user of the garment 5 may feel comfortable to wear the garment. In a system that detects a pedestrian by applying light and infrared rays to display the detection result on a screen of a display, the existence of the pedestrian can be recognized only on the screen of the display. However, according to the present disclosure, the existence of the pedestrian can be recognized by direct visibility without watching the screen of a display.

In case of the group operation of the light emitting devices 7 in cooperation with others, the light emitting devices 7 attached to the light emitting garment 2 perform operations different from one another or from a partial group. In this case, only the light emitting device 7 identified by the arrangement ID operates. Accordingly, by specifying the arrangement ID to control the flash or illumination of the light emitting unit 10, specific information (characters and images) can be displayed by the light emitting devices 7. The electromagnetic wave transmitted from the power transmission unit 21 of the vehicular apparatus 4 switches the operation pattern of the flash or illumination in response to the amount of the reception power received by the power reception unit 13 of each light emitting device 7. Therefore, by setting and performing different pattern operations of the flash or illumination, the pedestrian can recognize the distance from the vehicle 3 to the pedestrian, and the pedestrian's safety can be ensured more properly.

The present disclosure is not limited only to the above embodiments, and can be modified or extended as follows. Further, some modifications may be combined as one embodiment.

The light emitting devices may be activated only in the nighttime. An illuminance sensor may be provided to flash or illuminate the light emitting devices when the ambient darkness level is equal to or less than a predetermined level. Alternatively, the light emitting devices may flash or illuminate in a specific time zone (nighttime). Further, by providing a detection portion that detects not only nighttime but also inferior eyesight conditions such as rain, snow, and fog, the light emitting devices may flash or illuminate under such inferior eyesight conditions. With such a configuration, the light emitting devices can be operated only under the inferior eyesight condition, the activation and deactivation of the light emitting devices can be restricted to a required minimum, and the lifetimes of the light emitting devices can be prolonged.

The light emitting unit may flash or illuminate using one color.

The procedure has been explained in which each light emitting device detects a change of the state of the adjoining light emitting device by using light as a medium. Sounds and vibrations may be used as the mediums.

The configuration of the two-dimensional combination of the light emitting devices has been explained in the above. Alternatively, the light emitting devices may be combined one-dimensionally (straightly) or three-dimensionally (stereoscopically).

The in-vehicle device may acquire and identify the number and arrangement of the light emitting devices by data communications with the light emitting devices attached to the light emitting garment. Then, the in-vehicle device may set the aspect of flash and illumination in each light emitting garment by specifying the arrangement ID on the basis of the identified number and arrangement of the light emitting devices.

While the disclosure has been described with reference to preferred embodiments thereof, it is to be understood that the disclosure is not limited to the preferred embodiments and constructions. The disclosure is intended to cover various modification and equivalent arrangements. In addition, while the various combinations and configurations, which are preferred, other combinations and configurations, including more, less or only a single element, are also within the spirit and scope of the disclosure.

The invention claimed is:

1. A pedestrian safety system comprising:
   a power transmission unit provided to a vehicle and transmitting an electric power;
   a power reception unit provided to a wearable member being wearable by a pedestrian, and the power reception unit receiving the electric power transmitted from the power transmission unit;
   a power storage unit provided to the wearable member and storing the electric power received by the power reception unit; and
   a plurality of light emitting units provided to the wearable member, and each of the plurality of light emitting units is capable of performing a flash or illumination operation with a supply of the electric power stored in the power storage unit as an operational power, wherein
   the power transmission unit transmits an electromagnetic wave,
   the power reception unit receives the electromagnetic wave transmitted from the power transmission unit and generates, as the electric power transmitted from the power transmission unit, an electric power using the received electromagnetic wave,
   the plurality of light emitting units are arranged at regular intervals and each of the plurality of light emitting units has an individual arrangement ID, and
   each of the plurality of light emitting units performs the flash or illumination operation when the individual arrangement ID is specified by the electromagnetic wave received by the power reception unit.

2. The pedestrian safety system according to claim 1, wherein the power reception unit switches an operation pattern of the flash or illumination operation in response to an amount of the electric power received by the power reception unit.

3. The pedestrian safety system according to claim 1, wherein
the at least one light emitting unit performs the flash or illumination operation when an ambient darkness level is equal to or less than a predetermined level.

4. The pedestrian safety system according to claim 1, wherein
the at least one light emitting unit performs the flash or illumination operation during a specific time zone.

5. The pedestrian safety system according to claim 1, wherein:
the electromagnetic wave includes an operation command that specifies a specified arrangement ID and an operation pattern; and
each of the plurality of light emitting units is configured to: compare the specified arrangement ID of the operation command with the individual arrangement ID of the light emitting unit; determine whether the individual arrangement ID of the light emitting unit matches the specified arrangement ID of the operation command; identify the operation pattern specified by the operation command when the individual arrangement ID of the light emitting unit matches the specified arrangement ID of the operation command; and perform the flash or illumination operation based on the operation pattern specified by the operation command when the individual arrangement ID of the light emitting unit matches the specified arrangement ID of the operation command.

6. The pedestrian safety system according to claim 5, wherein the each of the plurality of light emitting units is configured to not perform the flash or illumination operation when the individual arrangement ID of the light emitting unit does not match the specified arrangement ID of the operation command.

7. A wearable member, which has a light emitting function and is wearable by a pedestrian, comprising:
a power reception unit receiving an electric power transmitted from a power transmission unit provided to a vehicle;
a power storage unit storing the electric power received by the power reception unit; and
a plurality of light emitting units each of which being capable of performing a flash or illumination operation with use of the electric power stored in the power storage unit as an operational power, wherein
the power transmission unit transmits an electromagnetic wave,
the power reception unit receives the electromagnetic wave transmitted from the power transmission unit and generates, as the electric power transmitted from the power transmission unit, an electric power using the received electromagnetic wave,
the plurality of light emitting units are arranged at regular intervals and each of the plurality of light emitting units has an individual arrangement ID, and
each of the plurality of light emitting units performs the flash or illumination operation when the individual arrangement ID is specified by the electromagnetic wave received by the power reception unit.

* * * * *